US012641832B2

(12) United States Patent
Noh et al.

(10) Patent No.: US 12,641,832 B2
(45) Date of Patent: May 26, 2026

(54) THIN FILM TRANSISTOR WITH FLOURINE GRADIENT ACTIVE LAYER AND FABRICATING METHOD THEREOF

(71) Applicant: LG DISPLAY CO., LTD., Seoul (KR)

(72) Inventors: SoYoung Noh, Paju-si (KR); Seunghyo Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 733 days.

(21) Appl. No.: 17/941,257

(22) Filed: Sep. 9, 2022

(65) Prior Publication Data

US 2023/0079262 A1      Mar. 16, 2023

(30) Foreign Application Priority Data

Sep. 14, 2021    (KR) ........................ 10-2021-0122489

(51) Int. Cl.
*H01L 21/425*        (2006.01)
*H01L 21/02*        (2006.01)
(Continued)

(52) U.S. Cl.
CPC ....... *H10D 30/6755* (2025.01); *H10D 30/031* (2025.01)

(58) Field of Classification Search
CPC ............. H10D 30/6755; H10D 30/031; H10D 30/6757; H10D 30/6723; H10D 99/00; H10D 30/6739; H10D 30/6758; H10D 62/314; H10D 62/80; H10D 64/685; H10D 86/0221; H10D 86/60; H10D 86/441; H10D 86/423; H10D 86/481; H10D 86/411; H10D 86/471; H10D 86/021; H10D 86/40;
(Continued)

(56) References Cited

U.S. PATENT DOCUMENTS

2013/0137213 A1      5/2013  Egi et al.
2013/0320328 A1*   12/2013  Lee ................... H01L 21/02205
257/43
(Continued)

FOREIGN PATENT DOCUMENTS

KR      10-2008-0074574  A      8/2008
KR      2014-0013166  A      2/2014
(Continued)

OTHER PUBLICATIONS

Korean Office Action dated Nov. 13, 2024 issued in Patent Application No. 10-2021-0122489 (8 pages).

*Primary Examiner* — Ajay Ojha
*Assistant Examiner* — Tsz K Chiu
(74) *Attorney, Agent, or Firm* — Fish & Richardson P.C.

(57)        ABSTRACT

A thin film transistor, a fabricating method of the thin film transistor and a display device comprising the thin film transistor are provided, in which the thin film transistor includes an active layer on a substrate, and a gate electrode spaced apart from the active layer and at least partially overlapped with the active layer, wherein the active layer includes fluorine (F) and has a first surface in a direction opposite to the substrate, the active layer has a concentration gradient of fluorine (F) in which a concentration gradient of fluorine (F) along a direction parallel with the first surface is smaller than that of fluorine (F) along a direction perpendicular to the first surface.

19 Claims, 18 Drawing Sheets

(51) Int. Cl.

| | |
|---|---|
| *H01L 29/08* | (2006.01) |
| *H01L 29/786* | (2006.01) |
| *H10D 30/01* | (2025.01) |
| *H10D 30/67* | (2025.01) |

(58) Field of Classification Search
CPC ............. H10D 86/451; H10D 86/0212; H10D
86/0231; H10D 30/0312; H10D 30/0321;
H10D 30/6729; H10D 30/6731; H10D
30/674; H10D 30/6745; H10D 30/6756;
H10D 86/00; H10D 86/421; H10D
30/0316; H10D 30/6704; H10D 30/6708;
H10D 30/6715; H10D 30/673; H10D
30/6732; H10D 30/6736; H10D 30/6746;
H10D 86/0223; H10D 86/431; H10D
86/443; H10D 30/0314; H10D 30/6713;
H10D 30/6734; H10D 30/6743; H10D
62/10; H10D 62/60; H10D 64/62; H10D
8/00; H10D 8/045; H10D 86/425
See application file for complete search history.

(56) References Cited

U.S. PATENT DOCUMENTS

| | | | | |
|---|---|---|---|---|
| 2014/0054579 | A1* | 2/2014 | Kim ................... | H10D 30/6713 |
| | | | | 257/43 |
| 2017/0294464 | A1* | 10/2017 | Kwon ................ | H10D 30/6755 |
| 2019/0096681 | A1* | 3/2019 | Wei ................... | H01L 21/32134 |
| 2021/0408292 | A1* | 12/2021 | Sohn .................. | H10D 30/6755 |

FOREIGN PATENT DOCUMENTS

| | | |
|---|---|---|
| KR | 10-1418304 B1 | 7/2014 |
| KR | 10-2021-0086344 A | 7/2021 |

* cited by examiner

THIN FILM TRANSISTOR WITH FLOURINE GRADIENT ACTIVE LAYER AND FABRICATING METHOD THEREOF

CROSS-REFERENCE TO RELATED APPLICATION

This application claims the priority of Korean Patent Application No. 10-2021-0122489 filed on Sep. 14, 2021, which is hereby incorporated by reference in its entirety.

BACKGROUND

Field of the Disclosure

The present disclosure relates to a thin film transistor, a fabricating method thereof and a display device comprising the same.

Description of the Background

Since a thin film transistor may be fabricated on a glass substrate or a plastic substrate, the thin film transistor has been widely used as a switching element or a driving element of a display device such as a liquid crystal display device or an organic light emitting device.

The thin film transistor may be categorized into an amorphous silicon thin film transistor in which amorphous silicon is used as an active layer, a polycrystalline silicon thin film transistor in which polycrystalline silicon is used as an active layer and an oxide semiconductor thin film transistor in which oxide semiconductor is used as an active layer, based on a material constituting the active layer.

An oxide semiconductor thin film transistor (TFT), which has a large resistance change in accordance with an oxygen content, has an advantage in that desired properties may be easily obtained. Further, since an oxide constituting an active layer may be grown at a relatively low temperature during a process of fabricating the oxide semiconductor thin film transistor, the fabricating cost of the oxide semiconductor thin film transistor is reduced. In view of the properties of oxide, since an oxide semiconductor is transparent, it is favorable to embody a transparent display device. However, the oxide semiconductor thin film transistor has a problem in that stability and electron mobility are lower than those of the polycrystalline silicon thin film transistor.

In the oxide semiconductor, electrons mainly serve as carriers, and characteristics of the oxide semiconductor thin film transistors may vary due to a concentration change of the electrons. For example, when an oxygen vacancy occurs in the oxide semiconductor, a threshold voltage of the oxide semiconductor thin film transistor may be shifted in a negative direction by increase of the electrons that are carriers. In addition, when the oxide thin film transistor is driven, a change may occur in the threshold voltage due to an influence of hydrogen (H), etc. permeated into the oxide semiconductor layer. When the change occurs in the threshold voltage, since the thin film transistor is not driven uniformly, reliability of the thin film transistor may be deteriorated, and display quality of a display device that uses the thin film transistor may be deteriorated.

In addition, when the oxide semiconductor thin film transistor (TFT) is driven in an ON-state for a long time, the threshold voltage tends to be continuously changed. Therefore, it is required to improve driving stability of the oxide semiconductor thin film transistor.

SUMMARY

The present disclosure has been made in view of the above problems and is to provide a thin film transistor that has excellent driving stability and reliability.

The present disclosure is also to provide a thin film transistor that has excellent stability as a threshold voltage is prevented from being shifted in a negative direction.

The present disclosure is also to provide a thin film transistor in which mobility is increased to improve an ON-current.

The present disclosure is also to provide a thin film transistor in which a conductorization permeation depth $\Delta L$ is minimized to form a short channel.

The present disclosure is also to provide a thin film transistor comprising an active layer including fluorine (F).

The present disclosure is also to provide a thin film transistor comprising a gate insulating layer including fluorine (F).

Further, the present disclosure is to provide a thin film transistor comprising a buffer layer including fluorine (F).

In addition to the mentioned above, additional features of the present disclosure will be clearly understood by those skilled in the art from the following description of the present disclosure.

In accordance with an aspect of the present disclosure, a thin film transistor includes an active layer on a substrate, and a gate electrode spaced apart from the active layer and at least partially overlapped with the active layer, wherein the active layer includes fluorine (F) and has a first surface in a direction opposite to the substrate, the active layer has a concentration gradient of fluorine (F) in which a concentration gradient of fluorine (F) along a direction parallel with the first surface is smaller than that of fluorine (F) along a direction perpendicular to the first surface.

The active layer may have a concentration gradient of fluorine (F), which is reduced along a direction from the first surface to the substrate.

The active layer may have a concentration gradient of fluorine (F), which is increased along a direction from the first surface to the substrate.

The active layer may have a concentration gradient of fluorine (F), which is increased and then reduced along a direction from the first surface to the substrate.

The active layer may not substantially have a concentration gradient of fluorine along the direction parallel with the first surface at the same depth from the first surface.

A concentration of fluorine in the active layer may be 0.001 atomic % (at %) to 10 at %.

The thin film transistor may further comprise a gate insulating layer between the active layer and the gate electrode, and the gate insulating layer may include fluorine (F).

The concentration gradient of fluorine (F) along the direction parallel with the first surface in the gate insulating layer may be smaller than that of fluorine (F) along the direction perpendicular to the first surface.

The gate insulating layer may not substantially have a concentration gradient of fluorine along the direction parallel with a surface of the substrate.

The gate insulating layer may have a concentration gradient of fluorine, which is increased along a direction toward the substrate.

The gate insulating layer may have a concentration gradient of fluorine, which is increased and then reduced along a direction toward the substrate.

The gate insulating layer may be disposed at a point having the same height as that of the active layer based on the surface of the substrate, and a concentration of fluorine in the gate insulating layer may be increased at a period, at which a concentration of fluorine in the active layer is increased, along the direction toward the substrate, and a concentration of fluorine in the gate insulating layer may be reduced at a period at which the concentration of fluorine in the active layer is reduced.

The thin film transistor may further comprise a buffer layer on the substrate, and the active layer may be disposed on the buffer layer, and the buffer layer may include fluorine (F).

In the buffer layer, a concentration gradient of fluorine (F) along the direction parallel with the surface of the substrate may be smaller than that of fluorine (F) along the direction perpendicular to the surface of the substrate.

The buffer layer may not substantially have a concentration gradient of fluorine along the direction parallel with the surface of the substrate.

The buffer layer may have a concentration gradient of fluorine, which is reduced along the direction toward the substrate.

The buffer layer has a concentration gradient of fluorine, which is increased and then reduced along the direction toward the substrate.

The active layer may include an oxide semiconductor material.

The active layer may include a first oxide semiconductor layer, and a second oxide semiconductor layer on the first oxide semiconductor layer.

The active layer may further include a third oxide semiconductor layer on the second oxide semiconductor layer.

In accordance with another aspect of the present disclosure, a display device includes the above thin film transistor.

In accordance with other aspect of the present disclosure, a fabricating method of a thin film transistor includes forming an active layer on a substrate, forming a gate insulating layer, which is in contact with the active layer, on the substrate, and treating the active layer and the gate insulating layer with fluorine (F) at the same time.

The treating the layers with fluorine (F) may include at least one of fluorine doping or fluorine plasma treatment.

The gate insulating layer may be formed on the active layer, and the fluorine may be injected through the gate insulating layer.

The fabricating method may further comprise treating the active layer and the gate insulating layer with heat after treating the layers with fluorine (F).

The fabricating method may further comprise forming a buffer layer on the substrate, and in the treating the layers with fluorine (F), the buffer layer may be treated with fluorine.

BRIEF DESCRIPTION OF THE DRAWINGS

The above and other features and other advantages of the present disclosure will be more clearly understood from the following detailed description taken in conjunction with the accompanying drawings, in which.

DETAILED DESCRIPTION

Figure 1:
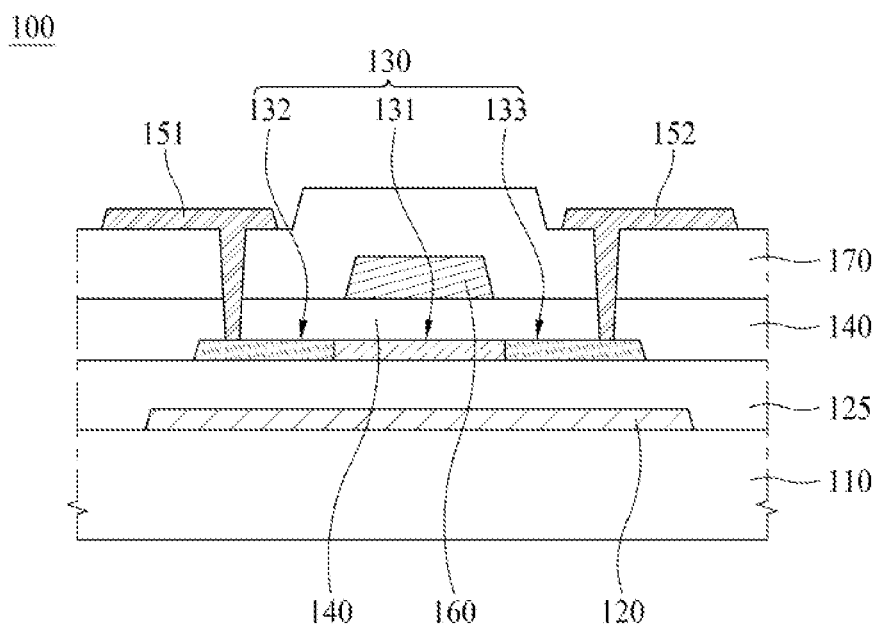
FIG. 1 is a cross-sectional view illustrating a thin film transistor according to one aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as should be 'upon~', 'above~', 'below~', and 'next to~', one or more portions may be arranged between two other portions unless 'just' or 'direct' is used.

Spatially relative terms such as "below", "beneath", "lower", "above", and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below", or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

In the drawings, the same or similar elements are denoted by the same reference numerals even though they are depicted in different drawings.

In the aspects of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one aspect of the present disclosure may be the drain electrode in another aspect of the present disclosure, and the drain electrode in any one aspect of the present disclosure may be the source electrode in another aspect of the present disclosure.

In some aspects of the present disclosure, for convenience of description, a source region is distinguished from a source electrode, and a drain region is distinguished from a drain electrode. However, the aspects of the present disclosure are not limited to this structure. For example, a source region may be a source electrode, and a drain region may be a drain electrode. Also, a source region may be a drain electrode, and a drain region may be a source electrode.

FIG. 1 is a cross-sectional view illustrating a thin film transistor 100 according to one aspect of the present disclosure.

Referring to FIG. 1, the thin film transistor 100 according to one aspect of the present disclosure includes an active layer 130 and a gate electrode 160. The active layer 130 and the gate electrode 160 are disposed on a substrate 110. Referring to FIG. 1, the thin film transistor 100 according to one aspect of the present disclosure may include a source electrode 151 and a drain electrode 152. The active layer 130 may be disposed on the substrate 110.

The substrate 110 may include at least one of glass or a polymer resin. For example, a glass substrate or a polymer resin substrate may be used as the substrate 110. There is a plastic substrate as the polymer resin substrate. The plastic substrate may include at least one of polyimide (PI), polycarbonate (PC), polyethylene (PE), polyester, polyethylene terephthalate (PET) or polystyrene (PS), which is a transparent polymer resin having flexible properties.

According to one aspect of the present disclosure, as shown in FIG. 1, a light shielding layer 120 may be disposed on the substrate 110. The light shielding layer 120 has light shielding characteristics. The light shielding layer 120 may shield light incident from the substrate 110 to protect the active layer 130.

The light shielding layer 120 may include metal. The light shielding layer 120 may be made of a single layer, or may have a multi-layered structure.

A buffer layer 125 may be disposed on the light shielding layer 120. The buffer layer 125 covers an upper surface of the light shielding layer 120. The buffer layer 125 has insulation properties and protects the active layer 130. The buffer layer 125 may be referred to as a protective layer or an insulating layer.

The buffer layer 125 may include at least one of silicon oxide (SiOx), silicon nitride (SiNx), hafnium oxide (HfOx), aluminum oxide (AlOx), zirconium oxide (ZrOx), hafnium silicate (Hf-SiOx) and zirconium silicate (Zr-SiOx), which has insulation properties.

Referring to FIG. 1 the active layer 130 is disposed on the buffer layer 125. The active layer 130 overlaps the light shielding layer 120.

According to one aspect of the present disclosure, the active layer 130 includes an oxide semiconductor material. According to one aspect of the present disclosure, the active layer 130 may be an oxide semiconductor layer made of an oxide semiconductor material, for example.

The active layer 130 may include at least one of an IO(InO)-based, a ZO(ZnO)-based, a TO(SnO)-based, a GO(GaO)-based, an IZO(InZnO)-based, an IGO(InGaO)-based, an IGZO(InGaZnO)-based, an IGZTO(InGaZnSnO)-based, a GZTO(GaZnSnO)-based, a GZO(GaZnO)-based, an ITO(InSnO)-based, an ITZO(InSnZnO)-based and a FIZO(FeInZnO)-based oxide semiconductor material.

Figure 4:
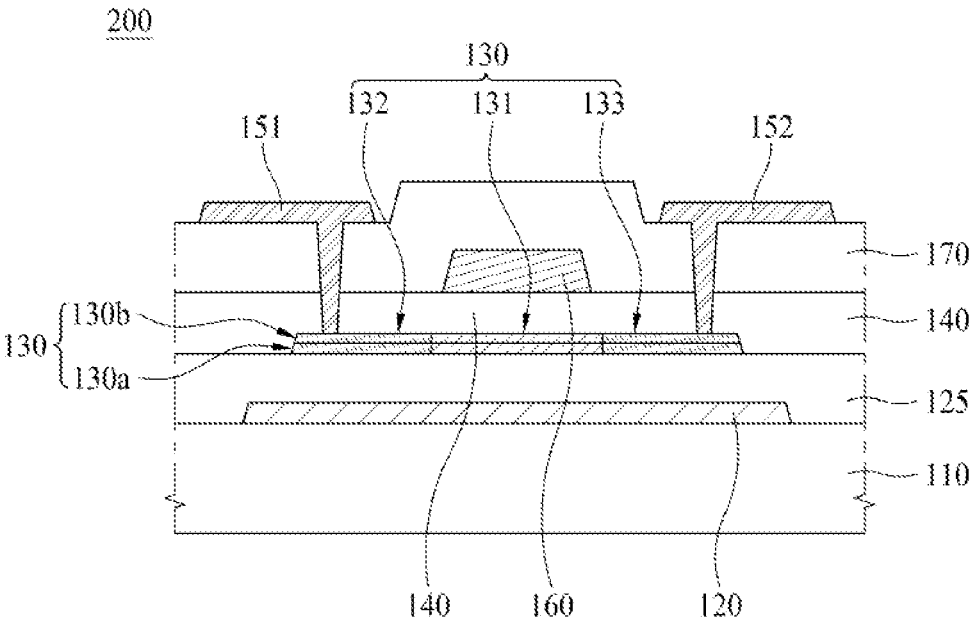
FIG. 4 is a cross-sectional view illustrating a thin film transistor according to another aspect of the present disclosure.
Figure 5:
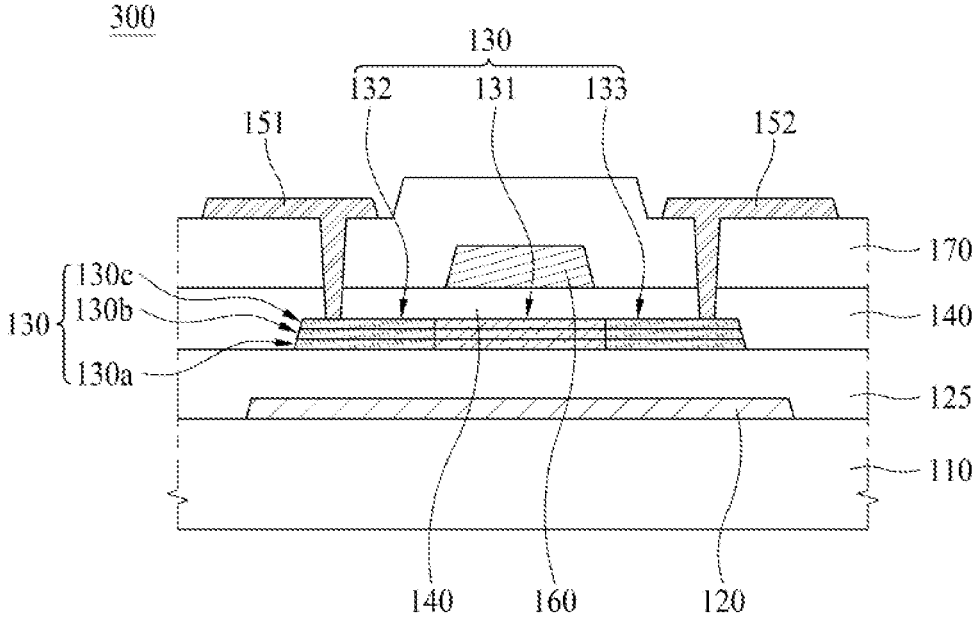
FIG. 5 is a cross-sectional view illustrating a thin film transistor according to still another aspect of the present disclosure.

The active layer 130 may have a single layered structure, or may have a multi-layered structure that includes a plurality of oxide semiconductor layers (shown in FIGS. 4 and 5).

A gate insulating layer 140 is disposed on the active layer 130. The gate insulating layer 140 may include at least one of silicon oxide (SiOx), silicon nitride (SiNx), hafnium oxide (HfOx), aluminum oxide (AlOx), zirconium oxide (ZrOx), hafnium silicate (Hf-SiOx) and zirconium silicate (Zr-SiOx). The gate insulating layer 140 may have a single layered structure, or may have a multi-layered structure.

As shown in FIG. 1, the gate insulating layer 140 may not be patterned, and may cover an entire upper surface of the active layer 130. Also, the gate insulating layer 140 may fully cover the upper surface of the active layer 130 or an upper portion of the substrate 110 except a contact hole.

A gate electrode 160 is disposed on the gate insulating layer 140. The gate electrode 160 is spaced apart from the active layer 130 and at least partially overlaps the active layer 130. The gate electrode 160 overlaps a channel portion 131 of the active layer 130.

The gate electrode 160 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo), a molybdenum alloy, chromium (Cr), tantalum (Ta), neodymium (Nd) and titanium (Ti). The gate electrode 160 may have a multi-layered structure that includes at least two conductive layers having their respective physical properties different from each other.

An interlayer insulating layer 170 is disposed on the gate electrode 160. The interlayer insulating layer 170 is an insulating layer made of an insulating material. In detail, the interlayer insulating layer 170 may be made of an organic material, may be made of an inorganic material, or may be made of a stacked body of an organic layer and an inorganic layer.

A source electrode 151 and a drain electrode 152 are disposed on the interlayer insulating layer 170. The source electrode 151 and the drain electrode 152 are spaced apart from each other and connected to the active layer 130, respectively. The source electrode 151 and the drain electrode 152 are respectively connected to the active layer 130 through a contact hole formed in the interlayer insulating layer 170.

Each of the source electrode 151 and the drain electrode 152 may include at least one of molybdenum (Mo), aluminum (Al), chromium (Cr), gold (Au), titanium (Ti), nickel (Ni), neodymium (Nd), copper (Cu) or their alloy. Each of the source electrode 151 and the drain electrode 152 may be made of a single layer made of a metal or a metal alloy, or may be made of two or more layers.

According to one aspect of the present disclosure, the active layer 130 includes a channel portion 131, a first connection portion 132, and a second connection portion 133. The first connection portion 132 and the second connection portion 133 may be formed by selective conductorization of the active layer 130. The first connection portion 132 and the second connection portion 133 are generally disposed on both sides of the channel portion 131.

The channel portion 131 has semiconductor characteristics. The channel portion 131 overlaps the light shielding layer 120. The light shielding layer 120 may prevent light incident from the substrate 110 from reaching the channel portion 131 of the active layer 130, thereby protecting the channel portion 131. Also, the channel portion 131 overlaps the gate electrode 160.

According to one aspect of the present disclosure, the active layer 130 may be selectively conductorized by selective conductorization using the gate electrode 160 as a mask.

An area of the active layer 130, which is overlapped with the gate electrode 160, is not conductorized and thus becomes the channel portion 131. An area of the active layer 130, which is not overlapped with the gate electrode 160, is conductorized and thus becomes the first connection portion 132 and the second connection portion 133.

According to one aspect of the present disclosure, the active layer 130 may be selectively conductorized by, for example, a plasma treatment or a dry etch, but one aspect of the present disclosure is not limited thereto. The active layer 130 may be selectively conductorized by doping using a dopant. At this time, the doped area is conductorized. For doping, doping may be performed by at least one of, for example, boron (B) ions, phosphorus (P) ions, arsenic (As) ions or antimony (Sb) ions. In addition, the active layer 130 may be selectively conductorized by light irradiation.

For example, as shown in FIG. 1, when the gate insulating layer 140 is not patterned and covers the entire supper surface of the active layer 130, the active layer 130 may be selectively conductorized by doping using a dopant. As a result, even though the gate insulating layer 140 is not patterned, the first connection portion 132 and the second connection portion 133 of the active layer 130 may be formed.

According to one aspect of the present disclosure, any one of the first connection portion 132 and the second connection portion 133 may be a source area and the other one thereof may be a drain area. The source area may serve as a source connection portion connected with the source electrode 151. The drain area may serve as a drain connection portion connected with the drain electrode 152.

The first connection portion 132 and the second connection portion 133, which are shown in the drawings, are distinguished from each other for convenience of description and the first connection portion 132 and the second connection portion 133 may be used interchangeably. The first connection portion 132 may be a source area and the second connection portion 133 may be a drain area. In addition, the first connection portion 132 may be a drain area and the second connection portion 133 may be a source area.

According to one aspect of the present disclosure, the first connection portion 132 may serve as a source electrode or may serve as a drain electrode. In addition, the second connection portion 133 may serve as a drain electrode, or may serve as a source electrode.

A thin film transistor TFT is formed by the active layer 130, the gate electrode 160, the source electrode 151 and the drain electrode 152. As shown in FIG. 1, a thin film transistor in which the gate electrode 160 is disposed above the active layer 130 may be referred to as a thin film transistor TFT of a top gate structure.

Figure 2:
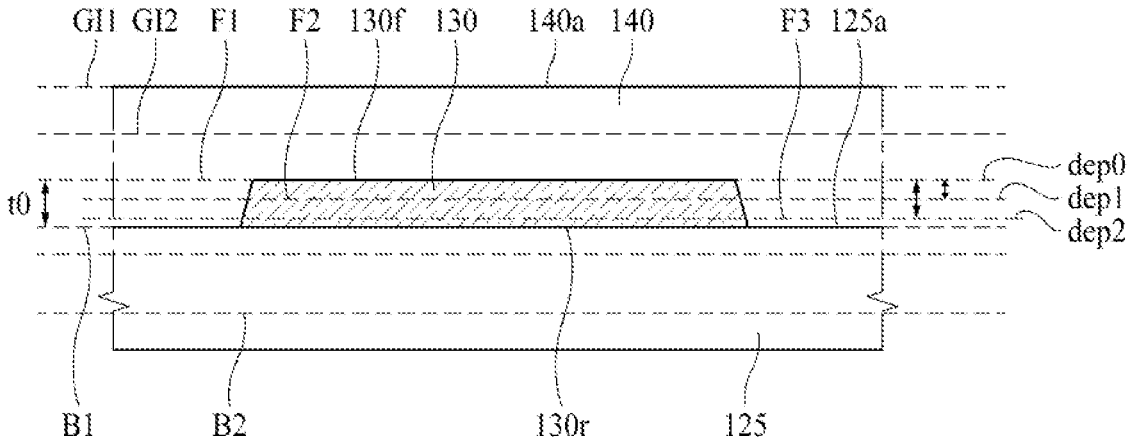
FIG. 2 is an enlarged cross-sectional view illustrating a buffer layer, an active layer and a gate insulating layer.

FIG. 2 is an enlarged cross-sectional view illustrating a buffer layer, an active layer and a gate insulating layer.

According to one aspect of the present disclosure, the active layer 130 includes fluorine (F). According to one aspect of the present disclosure, "fluorine (F)" is meant to include both fluorine ions and fluorine atoms that are not ionized.

According to one aspect of the present disclosure, fluorine (F) in the active layer may be present in a state of being combined with a metal. In this case, the fluorine (F) may be in an ion state.

According to one aspect of the present disclosure, the active layer 130 has a first surface 130f in a direction opposite to the substrate 110. For example, the first surface 130f of the active layer 130 may be defined as a surface of the active layer 130 opposite to the substrate 110. The first surface 130f of the active layer 130 may be referred to as the upper surface of the active layer 130.

According to one aspect of the present disclosure, the active layer 130 may have a concentration gradient of fluorine (F) along a thickness direction of the active layer 130. In more detail, the concentration of fluorine F may vary along the thickness direction of the active layer 130. According to one aspect of the present disclosure, the concentration of fluorine (F) in the active layer 130 may be reduced or increased along the direction toward the substrate 110. In the active layer 130, the tendency of the concentration of fluorine F, which is increased or reduced along the thickness direction, may vary depending on where the concentration of fluorine F is maximum, as described in detail below.

Referring to FIG. 2, the active layer 130 may have a thickness of t0. The thickness t0 of the active layer 130 may be defined as a distance between a second surface 130r, which is the bottom surface of the active layer 130, and the first surface 130f that is the upper surface of the active layer 130. The second surface 130r of the active layer 130 may be in contact with an upper surface of the buffer layer 125. According to one aspect of the present disclosure, the upper surface of the buffer layer 125 is referred to as a first surface 125a of the buffer layer 125.

According to one aspect of the present disclosure, a depth of each portion of the active layer 130 is defined as a distance from the first surface 130f of the active layer 130 toward the substrate 110.

In FIG. 2, F1 denotes the same depth or the same height as that of the first surface 130f of the active layer 130. In FIG. 2, the depth of the active layer 130 corresponding to F1 may be represented as "dep0".

According to one aspect of the present disclosure, there is no difference or little difference in the concentration of fluorine (F) at different points of the first surface 130f of the active layer 130, so that the concentration of fluorine (F) may be substantially uniform at the different points.

In FIG. 2, F2 denotes the same depth as the first depth dep1 of the active layer 130. In the active layer 130, there is no difference or little difference in the concentration of fluorine (F) at different points having a first depth dep1, so that the concentration of fluorine (F) may be substantially uniform at the different points.

In FIG. 2, F3 denotes the same depth as the second depth dep2 of the active layer 130. In the active layer 130, there is no difference or little difference in the concentration of fluorine (F) at different points having a second depth dep2, so that the concentration of fluorine (F) may be substantially uniform at the different points.

According to one aspect of the present disclosure, the gate insulating layer 140 is disposed between the active layer 130 and the gate electrode 160, and may include fluorine (F).

The active layer 130 according to one aspect of the present disclosure has a concentration gradient of fluorine (F). According to one aspect of the present disclosure, in the active layer 130, the concentration gradient of fluorine (F) along a direction parallel with the first surface 130f is smaller than the concentration gradient of fluorine (F) along a direction perpendicular to the first surface 130f. The direction parallel with the first surface 130f may be referred to as a horizontal direction, and a direction perpendicular to the first surface 130f may be referred to as a thickness direction or a depth direction.

According to one aspect of the present disclosure, fluorine (F) may be doped through an upper portion of the active layer 130 or an upper portion of the gate insulating layer 140. In this way, when fluorine (F) is doped from the upper surface in the same condition, there is little difference in the concentration of fluorine (F) along a horizontal direction in each layer, and a concentration gradient of fluorine (F) close to zero along the horizontal direction may be provided. On the other hand, the concentration of fluorine (F) along the thickness direction may vary depending on energy applied during doping of fluorine (F). Therefore, according to one aspect of the present disclosure, in the active layer 130, the concentration gradient of fluorine (F) along the depth direction may be greater than the concentration gradient of fluorine (F) along the horizontal direction.

The concentration gradient of fluorine (F) may be described with reference to FIGS. 3A, 3B, 3C and 3D. FIGS. 3A, 3B, 3C and 3D are graphs illustrating the concentration of fluorine (F) for each position.

Figure 3A:
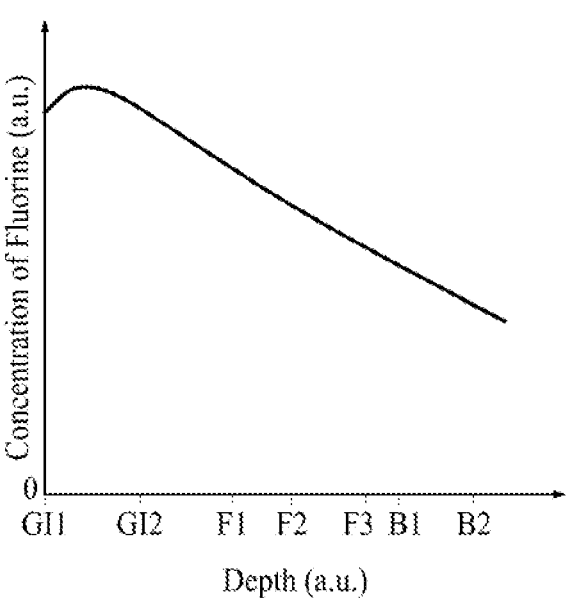
FIGS. 3A, 3B, 3C and 3D are graphs illustrating a concentration of fluorine (F) per position.

According to one aspect of the present disclosure, the active layer 130 may have a concentration gradient of fluorine (F) reduced along a direction from the first surface 130f toward the substrate 110. For example, as shown in FIG. 3A, when the concentration of fluorine (F) is maximum at any point outside the upper portion of the active layer 130, the active layer 130 may have a concentration tendency of fluorine (F), which is gradually reduced along the direction toward the substrate 110.

Figure 3B:
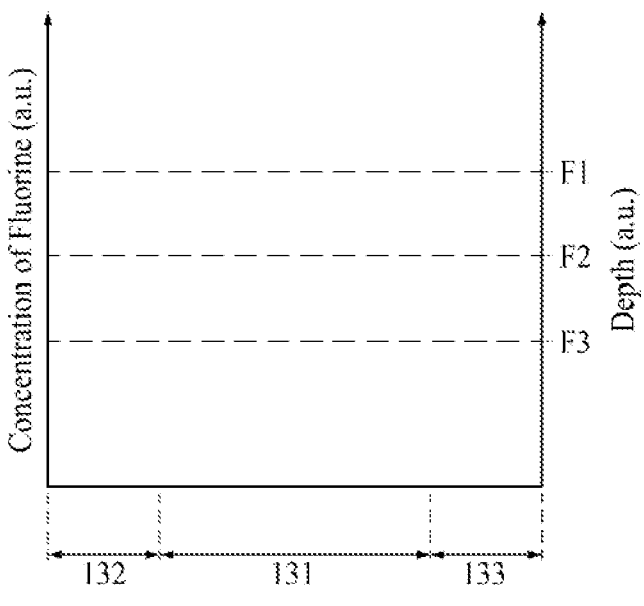

FIG. 3B shows the concentration of fluorine (F) for each position of the active layer 130. In detail, FIG. 3B shows the concentration of fluorine (F) in the horizontal direction in the active layer 130 having a concentration tendency in the same depth direction as that shown in FIG. 3A. A horizontal axis of FIG. 3B corresponds to the first connection portion 132, the channel portion 131 and the second connection portion 133 of the active layer 130, along the direction from left to right in FIG. 1. Referring to FIG. 3B, the concentration of fluorine (F) of the active layer 130 may be maintained to be constant or substantially constant, respectively, at a depth depth0 corresponding to F1, a depth depth1 corresponding to F2 and a depth depth2 corresponding to F3.

Therefore, according to one aspect of the present disclosure, the active layer 130 may not have a concentration gradient of fluorine substantially along a direction parallel with the first surface 130f, at the same depth from the first surface 130f. Alternatively, according to one aspect of the present disclosure, the active layer 130 may have a concentration gradient of fluorine, which is close to zero or zero along a direction parallel with the first surface 130f at the same depth from the first surface 130f.

Figure 3C:
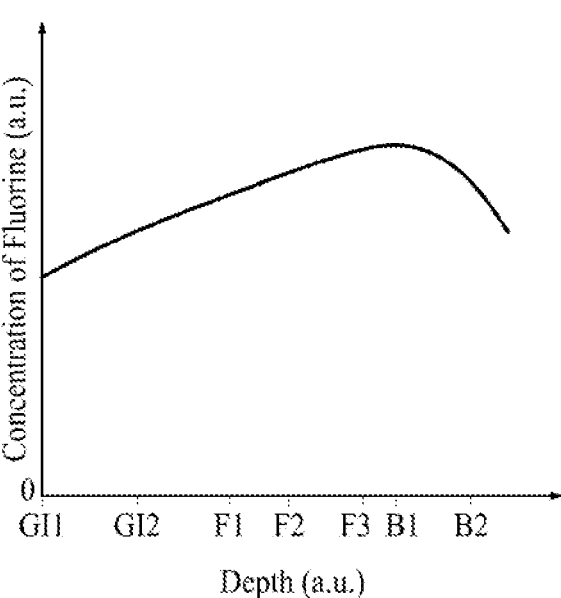

According to one aspect of the present disclosure, the active layer 130 may have a concentration gradient of fluorine (F), which is increased along a direction from the first surface 130f toward the substrate 110. For example, as shown in FIG. 3C, when the concentration of fluorine (F) is maximum at any point outside a lower portion of the active layer 130, the active layer 130 may have a concentration tendency of fluorine (F), which is gradually increased along the direction toward the substrate 110.

Figure 3D:
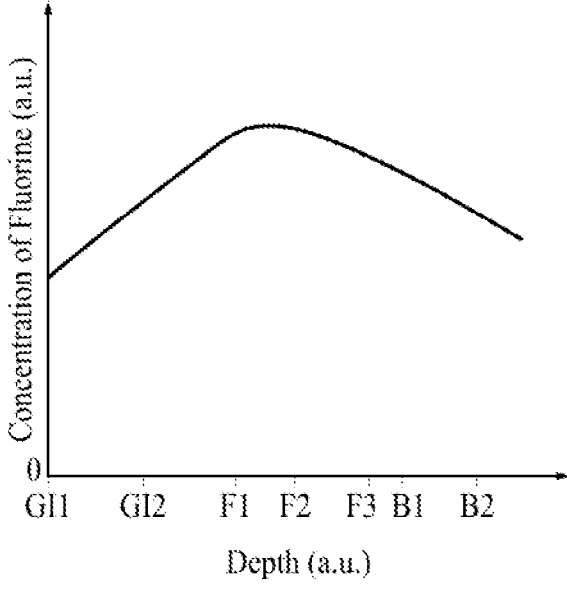

According to one aspect of the present disclosure, the active layer 130 may have a concentration gradient of fluorine (F), which is increased and then reduced along the direction from the first surface 130f toward the substrate 110. For example, as shown in FIG. 3D, when the concentration of fluorine (F) is maximum inside the active layer 130, the active layer 130 may have a concentration tendency of fluorine (F), which is gradually increased and reduced along the direction toward the substrate 110.

According to one aspect of the present disclosure, in the gate insulating layer 140, the concentration gradient of fluorine (F) along the direction parallel with the first surface 130f of the active layer 130 may be smaller than that of fluorine (F) along the direction perpendicular to the first surface 130f of the active layer 130

In more detail, the gate insulating layer 140 may have the same concentration or substantially the same concentration of fluorine (F) at each point of the same depth from a first surface 140a of the gate insulating layer 140. For example, the concentration of fluorine (F) at each point of the first surface 140a of the gate insulating layer 140 may be uniform or substantially uniform.

According to one aspect of the present disclosure, the gate insulating layer 140 may not substantially have a concentration gradient of fluorine (F) along the direction parallel with the surface of the substrate 110.

According to one aspect of the present disclosure, the first surface 140a of the gate insulating layer 140 may be defined as a surface of the gate insulating layer 140 opposite to the substrate 110. The first surface 140a of the gate insulating layer 140 may be referred to as an upper surface of the gate insulating layer 140.

According to one aspect of the present disclosure, the gate insulating layer 140 may have a concentration gradient of fluorine (F) along the thickness direction of the gate insulating layer 140. According to one aspect of the present disclosure, in the gate insulating layer 140, the concentration of fluorine (F) in the gate insulating layer 140 may be reduced or increased along the direction toward the substrate 110.

According to one aspect of the present disclosure, when the concentration of fluorine (F) is maximum at any point outside the lower portion of the gate insulating layer 140, the gate insulating layer 140 may have a concentration gradient of fluorine, which is increased along the direction toward the substrate 110.

According to one aspect of the present disclosure, when the concentration of fluorine (F) is maximum in the gate insulating layer 140, the gate insulating layer 140 may have a concentration gradient of fluorine, which is increased and then reduced along the direction toward the substrate 110.

According to one aspect of the present disclosure, a depth of each portion of the gate insulating layer 140 is defined as a distance from the first surface 140a of the gate insulating layer 140 toward the substrate 110.

In FIG. 2, GI1 denotes the same depth or the same height as that of the first surface 140a of the gate insulating layer 140.

According to one aspect of the present disclosure, the concentration of fluorine (F) may be the same or substantially the same at different points of the first surface 140a of the gate insulating layer 140.

In FIG. 2, GI2 denotes the same depth as any one depth in the gate insulating layer 140. In the gate insulating layer 140, the concentration of fluorine (F) may be the same or substantially the same at different points having the same depth, for example, the depth of GI2.

According to one aspect of the present disclosure, the gate insulating layer 140 and the active layer 130 may have the same or similar tendency of the concentration gradient of fluorine (F) at the same depth. Referring to FIGS. 1 and 2, the gate insulating layer 140 may be disposed at a point having the same height as that of the active layer 130. For example, the gate insulating layer 140 may be disposed on the same layer as the active layer 130. In this case, the gate insulating layer 140 may be in contact with a side of the active layer 130. At this time, the concentration of fluorine (F) in the gate insulating layer 140 may be increased at a period at which the concentration of fluorine (F) of the active layer 130 is increased, along the direction toward the substrate 100, and the concentration of fluorine (F) in the gate insulating layer 140 may be reduced at a period at which the concentration of fluorine (F) in the active layer 130 is reduced.

For example, the gate insulating layer 140 and the active layer 130 may have the same concentration gradient tendency at a depth point of F2, and may have the same concentration gradient tendency at a depth point of F3.

According to one aspect of the present disclosure, the buffer layer 125 may be disposed between the substrate 110 and the active layer 130, and may include fluorine (F).

The buffer layer 125 may have the same or substantially the same concentration of fluorine (F) at each point of the same depth from the first surface 125a of the buffer layer 125. For example, the concentration of fluorine (F) at each point of the first surface 125a of the buffer layer 125 may be uniform or substantially uniform.

According to one aspect of the present disclosure, in the buffer layer 125, the concentration gradient of fluorine (F) along the direction parallel with the surface of the substrate 110 may be smaller than that of fluorine (F) along the direction perpendicular to the surface of the substrate 110.

According to one aspect of the present disclosure, the buffer layer 125 may not substantially have a concentration gradient of fluorine (F) along the direction parallel with the surface of the substrate 110.

According to one aspect of the present disclosure, the first surface 125a of the buffer layer 125 may be defined as a surface of the buffer layer 125 opposite to the substrate 110. The first surface 125a of the buffer layer 125 may be referred to as an upper surface of the buffer layer 125.

According to one aspect of the present disclosure, the buffer layer 125 may have a concentration gradient of fluorine (F) along the thickness direction of the buffer layer 125. According to one aspect of the present disclosure, in the buffer layer 125, the concentration of fluorine (F) in the buffer layer 125 may be reduced or increased along the direction toward the substrate 110.

According to one aspect of the present disclosure, when the concentration of fluorine (F) is maximum at any point outside the upper portion of the buffer layer 125, the buffer layer 125 may have a concentration gradient of fluorine, which is reduced along the direction toward the substrate 110 (see FIG. 3A).

According to one aspect of the present disclosure, when the concentration of fluorine (F) in the buffer layer 125 is maximum, the buffer layer 125 may have a concentration gradient of fluorine, which is increased and then reduced along the direction toward the substrate 110 (see FIG. 3C).

According to one aspect of the present disclosure, a depth of each portion of the buffer layer 125 is defined as a distance from the first surface 125a of the buffer layer 125 toward the substrate 110.

In FIG. 2, B1 denotes the same depth or the same height as that of the first surface 125a of the buffer layer 125.

According to one aspect of the present disclosure, the concentration of fluorine (F) may be uniform at different points of the first surface 125a of the buffer layer 125.

In FIG. 2, B2 denotes the same depth as any one depth in buffer layer 125. In the buffer layer 125, the concentration of fluorine (F) may be uniform at different points having the same depth, for example, a depth of B2.

According to one aspect of the present disclosure, the concentration of fluorine (F) based on the depth at each point of the thin film transistor 100 may be measured by a depth profile (ToF-SIMS) that uses a Time of Flight Secondary Ion Mass Spectrometry (ToF-SIMS), for example.

According to one aspect of the present disclosure, fluorine (F) may have a concentration gradient as shown in FIG. 3A, 3C or 3D along the thickness direction by starting from the first surface 140a of the gate insulating layer 140. In detail, fluorine (F) may have a concentration gradient in a manner, in which a concentration is reduced, increased, or increased and then reduced as a depth is increased, along the thickness direction from the first surface 140a of the gate insulating layer 140.

According to one aspect of the present disclosure, based on the thickness direction, the concentration of fluorine (F) in the gate insulating layer 140 may be increased at a period at which the concentration of fluorine (F) in the active layer 130 is increased, and the concentration of fluorine (F) in the gate insulating layer 140 may be reduced at a period at which the concentration of fluorine (F) in the active layer 130 is reduced.

According to one aspect of the present disclosure, after the gate insulating layer 140 is formed, the gate insulating layer 140 may be treated with fluorine (F), so that the active layer 130 includes fluorine (F). For example, fluorine may be injected into the active layer 130 by fluorine (F) ion doping or plasma treatment using fluorine (F). In this process, fluorine (F) may be injected into the gate insulating layer 140 and the buffer layer 125.

According to one aspect of the present disclosure, a point at which the concentration of fluorine (F) is maximized may be set depending on a purpose of use of the thin film transistor 100 and a composition of the active layer 130. For example, when fluorine (F) is supplied by fluorine (F) ion doping, an ion doping voltage may be adjusted to set the point at which the concentration of fluorine (F) is maximized.

In the active layer 130, fluorine (F) may replace oxygen (O), and an oxygen vacancy position may be filled with fluorine (F). Since fluorine (F) forms a stronger bond than oxygen (O) with respect to a metal, stability of the active layer 130 may be improved by fluorine (F). Since fluorine (F) has more outermost electrons than oxygen (O), when oxygen (O) is replaced with fluorine (F), a carrier concentration of the active layer 130 may be increased, and as a result, an ON-current of the thin film transistor 100 may be improved.

According to one aspect of the present disclosure, the concentration of fluorine (F) in the active layer 130 may be 0.001 atomic % (at %) to 10 at %. In this case, the atomic % (at %) may be calculated by a ratio of the number of fluorine (F) atoms to a total number of metal atoms constituting the active layer 130. The ratio of the number of atoms of each element constituting the active layer 130 may be calculated by a depth profile (ToF-SIMS) that uses a Time of Flight Secondary Ion Mass Spectrometry (ToF-SIMS).

When the concentration of fluorine (F) in the active layer 130 is less than 0.001 atomic % (at %), stability improvement effect and carrier concentration increase effect of the active layer 130 due to fluorine (F) may little occur. On the other hand, when the concentration of fluorine (F) in the active layer 130 exceeds 10 atomic % (at %), the semiconductor characteristics of the channel portion 131 in the active layer 130 may be deteriorated due to an excessive concentration of fluorine (F).

According to one aspect of the present disclosure, the concentration of fluorine (F) in the active layer 130 may be controlled more restrictively. For example, the active layer 130 may have a concentration of fluorine (F) in the range of 0.01 at % to 10 at % or 0.1 at % to 5 at %. In more detail, the active layer 130 may have a concentration of fluorine (F) in the range of 0.1 at % to 3 at %, may have a concentration of fluorine (F) in the range of 1 at % to 3 at %, or may have a concentration of fluorine (F) in the range of 0.1 at % to 1 at %.

According to one aspect of the present disclosure, the gate insulating layer 140 may have the same or similar concentration of fluorine as or to that of the active layer 130. In addition, the gate insulating layer 140 may have a concentration gradient pattern of fluorine, which is the same as or similar to that of the active layer 130.

FIG. 4 is a cross-sectional view illustrating a thin film transistor 200 according to another aspect of the present disclosure.

Referring to FIG. 4, the active layer 130 may include a first oxide semiconductor layer 130a and a second oxide semiconductor layer 130b on the first oxide semiconductor layer 130a.

The first oxide semiconductor layer 130a may serve as a support layer disposed on the buffer layer 125, supporting the second oxide semiconductor layer 130b. The second oxide semiconductor layer 130b may serve as a main channel layer.

The first oxide semiconductor layer 130a serving as a support layer may have excellent film stability and mechanical stability. The first oxide semiconductor layer 130a may include at least one of, for example, an IGZO(InGaZnO)-based, an IGO(InGaO)-based, an IGZTO(InGaZnSnO)-based, a GZTO(GaZnSnO)-based, a GZO(GaZnO)-based and a GO(GaO)-based oxide semiconductor material, but one aspect of the present disclosure is not limited thereto. The first oxide semiconductor layer 130a may be made of another oxide semiconductor material known in the art.

For example, the second oxide semiconductor layer 130b may be made of an oxide semiconductor material such as an IZO(InZnO)-based, a TO(SnO)-based, an IO(InO)-based, an IGO(InGaO)-based, an ITO(InSnO)-based, an IGZO(InGaZnO)-based, an IGZTO(InGaZnSnO)-based, a GZTO (GaZnSnO)-based, an ITZO(InSnZnO)-based and a FIZO (FeInZnO)-based semiconductor material, but one aspect of the present disclosure is not limited thereto. The second oxide semiconductor layer 130b may be made of another oxide semiconductor material known in the art.

FIG. 5 is a cross-sectional view illustrating a thin film transistor 300 according to still another aspect of the present disclosure.

The thin film transistor 300 shown in FIG. 5 further includes a third oxide semiconductor layer 130c on the second oxide semiconductor layer 130b as compared with the thin film transistor 200 shown in FIG. 4. The third oxide semiconductor layer 130c may be made of an oxide semiconductor material. The third oxide semiconductor layer 130c may be made of the same material as that of the first oxide semiconductor layer 130a, for example.

Figure 6:
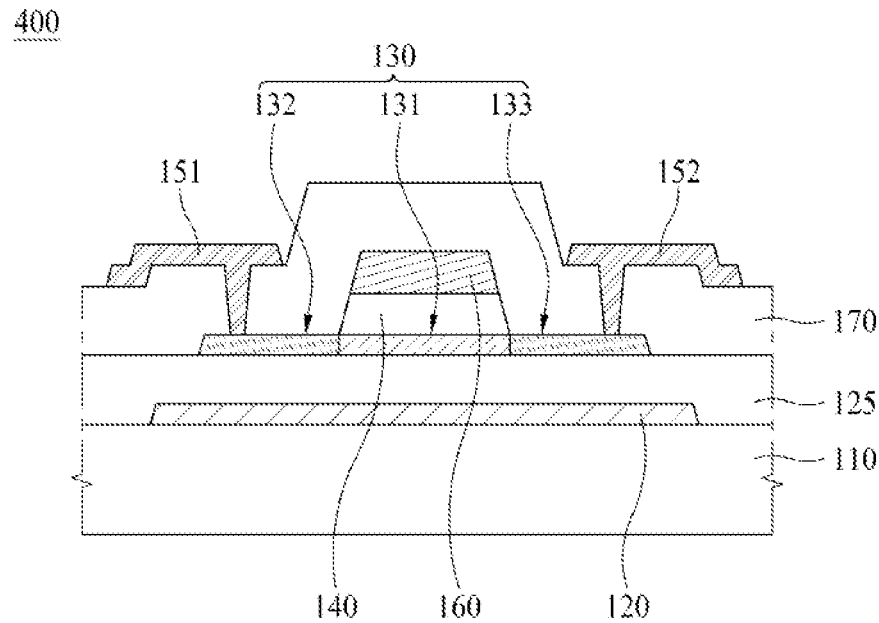
FIG. 6 is a cross-sectional view illustrating a thin film transistor according to further still another aspect of the present disclosure.

FIG. 6 is a cross-sectional view illustrating a thin film transistor 400 according to further still another aspect of the present disclosure.

Referring to FIG. 6, the gate insulating layer 140 may be patterned. According to further still another aspect of the present disclosure, even though a portion of the active layer 130 is not protected by the gate insulating layer 140 as the gate insulating layer 140 is patterned, the active layer 130 is stabilized with fluorine (F) and thus may have excellent stability. Therefore, even though the gate insulating layer 140 is patterned, reliability of the thin film transistor 400 is not deteriorated.

Figure 7:
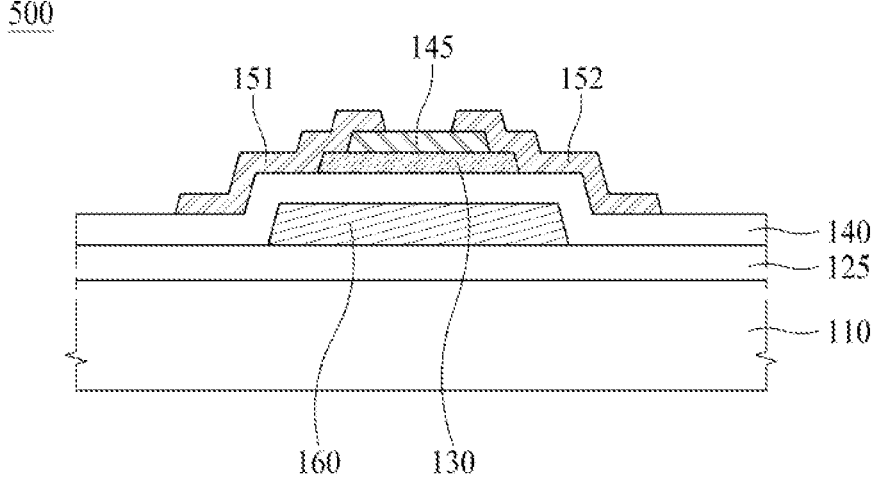
FIG. 7 is a cross-sectional view illustrating a thin film transistor according to further still another aspect of the present disclosure.

FIG. 7 is a cross-sectional view illustrating a thin film transistor 500 according to further still another aspect of the present disclosure.

The thin film transistor 500 of FIG. 7 includes a gate electrode 160 on the substrate 110, a gate insulating layer 140 on the gate electrode 160, an active layer 130 on the gate insulating layer 140, a source electrode 151 connected to the active layer 130, and a drain electrode 152 spaced apart from the source electrode 151 and connected to the active layer 130. Referring to FIG. 7, a buffer layer 125 may be disposed on the substrate 110.

Referring to FIG. 7, the thin film transistor 500 according to further still another aspect of the present disclosure may further include an etch stopper 145.

The active layer 130 may include an oxide semiconductor material. In addition, the active layer 130 may include fluorine (F). Since fluorine (F) included in the active layer 130 has been already described, its detailed description will be omitted to avoid redundancy.

Figure 8:
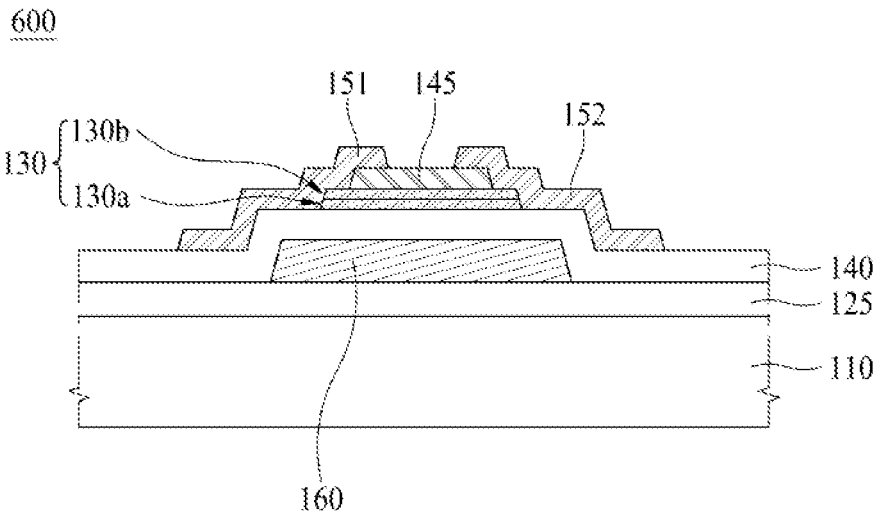
FIG. 8 is a cross-sectional view illustrating a thin film transistor according to further still another aspect of the present disclosure.

FIG. 8 is a cross-sectional view illustrating a thin film transistor 600 according to further still another aspect of the present disclosure.

As shown in FIG. 8, the active layer 130 may include a first oxide semiconductor layer 130a and a second oxide semiconductor layer 130b on the first oxide semiconductor layer 130a, but further still another aspect of the present disclosure is not limited thereto. The active layer 130 may further include a third oxide semiconductor layer 130c disposed on the second oxide semiconductor layer 130b.

Figure 9:
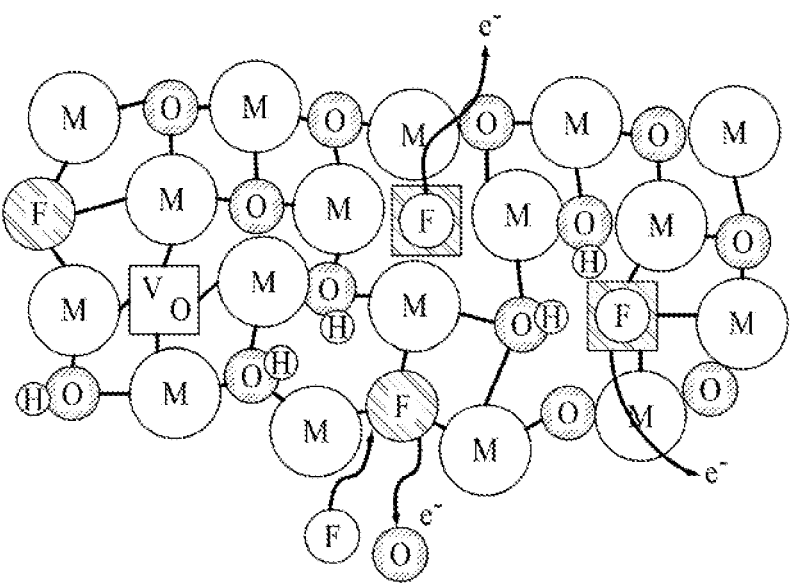
FIG. 9 is a schematic view illustrating arrangement and combination state of fluorine (F) in an active layer.

FIG. 9 is a schematic view illustrating arrangement and combination state of fluorine (F) in the active layer 130.

According to one aspect of the present disclosure, fluorine (F) injected into the active layer 130 may replace oxygen. In more detail, in the active layer 130 made of an oxide semiconductor material, fluorine (F) may be combined with a metal element by replacing oxygen. Fluorine (F) has a greater number of outermost electrons than oxygen. Therefore, when fluorine (F) is combined with a metal instead of oxygen, free electrons which may act as carriers may be additionally generated, as expressed by the following Equation 1.

$$MO \rightarrow MF + e^-$$ [Equation 1]

In the Equation 1, M is a metal.

In this way, when fluorine (F) is combined with a metal instead of oxygen in the active layer 130, free electrons that may act as carriers may be additionally generated, whereby mobility of the active layer 130 may be increased. As a result, the on-off current of the thin film transistors 100, 200, 300, 400, 500 and 600 may be increased.

Meanwhile, when oxygen vacancy $V_O$ is generated in the active layer 130 made of an oxide semiconductor material, a threshold voltage Vth of the thin film transistor is shifted in a negative (−) direction, whereby reliability of the thin film transistor is deteriorated.

According to one aspect of the present disclosure, fluorine (F) may fill the oxygen vacancy position generated in the active layer 130. For example, the oxygen vacancy position of the active layer 130 may be filled with fluorine (F) by a reaction such as Equation 2 below, whereby oxygen vacancy may be avoided. As a result, threshold voltage shift due to the oxygen vacancy of the active layer 130 may be avoided.

$$V_O^{2+} + 2e^- + F \rightarrow F^- + e^-$$ [Equation 2]

In the Equation 2, $V_O$ denotes oxygen vacancy, and "$V_O^{2+} + 2e$" means that oxygen in the +2 state, which is combined with the metal, escapes to generate two free electrons.

As noted from the Equation 2, electrons generated by oxygen vacancy are consumed to form fluorine (F) ions, and a cancellation effect of a gate voltage applied to the gate electrode 160 is generated by the fluorine (F) ions. As a result, the threshold voltage Vth of the thin film transistor is shifted in a positive (+) direction. Therefore, even though electrons that are carriers are additionally generated, the threshold voltage Vth of the thin film transistor is prevented from being shifted in the negative (−) direction.

As described above, the oxygen vacancy of the active layer 130 may be suppressed by the fluorine (F), and the threshold voltage may be prevented from being shifted in the negative (−) direction, whereby reliability of the thin film transistor is improved.

In general, fluorine (F) forms a stronger metal bond than oxygen (O). Therefore, as compared with oxygen, fluorine (F) may form a stronger bond with metals of the active layer 130. As a result, stability of the active layer 130 is improved by fluorine (F), and the channel portion 131 of the active layer 130 is prevented from being unnecessarily conductorized by hydrogen (H).

Figure 10:
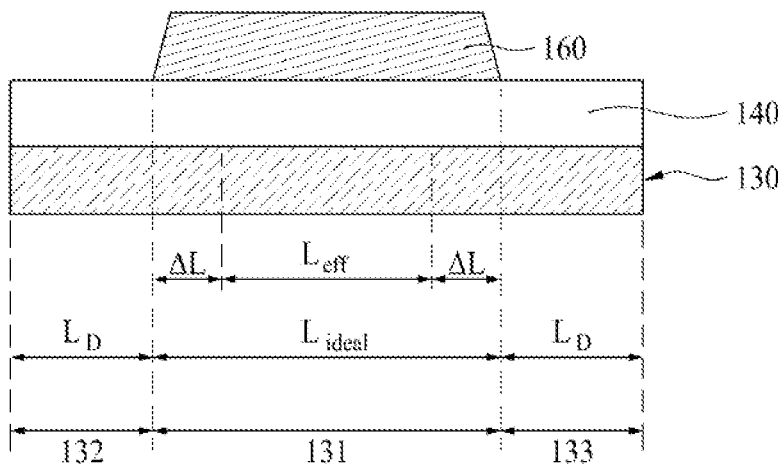
FIG. 10 is a schematic view illustrating a conductorization permeation depth $\Delta L$.

In general, the gate insulating layer 140 or the buffer layer 125, which is an insulating layer near the active layer 130, includes hydrogen (H). Hydrogen H may be included in a material for forming the gate insulating layer 140 or the buffer layer 125, or may be introduced from the outside. When such hydrogen is permeated into the channel portion 131 of the active layer 130, the channel portion 131 may be conductorized. For example, when hydrogen is permeated into an edge of the channel portion 131, as shown in FIG. 10, a conductorization permeation depth ΔL may be increased, whereby an effective channel length of the channel portion 131 may be reduced.

According to one aspect of the present disclosure, fluorine (F) may be strongly combined with metals of the active layer 130 to prevent hydrogen from being permeated into the channel portion 131. As a result, the conductorization permeation depth ΔL may be reduced to easily make sure of the effective channel length. In this case, the thin film transistor may be driven even by a short channel having a short length of the channel portion 131. Therefore, according to one aspect of the present disclosure, the active layer 130 includes fluorine (F), and thus a short channel may be implemented.

According to one aspect of the present disclosure, the gate insulating layer 140 and the buffer layer 125 may include fluorine (F). Fluorine (F) included in the gate insulating layer 140 and the buffer layer 125 may form a strong bond with hydrogen. As fluorine (F) forms a strong bond with hydrogen, hydrogen included in the gate insulating layer 140 and the buffer layer 125 may be prevented from being shifted to the channel portion 131 of the active layer 130, and the channel portion 131 of the active layer 130 may be prevented from being unnecessarily conductorized by hydrogen.

Therefore, according to one aspect of the present disclosure, the channel portion 131 of the active layer 130 may be prevented from being unnecessarily conductorized by fluorine (F) included in the gate insulating layer 140 and the buffer layer 125. As a result, stability and reliability of the thin film transistor may be improved.

FIG. 10 is a schematic view illustrating a conductorization permeation depth ΔL.

In the process of forming the active layer 130, a portion of the channel portion 131 may be conductorized so that a portion, which cannot serve as a channel, may be generated. According to one aspect of the present disclosure, a length of a portion of the channel portion 131, which is conductorized so as not to serve as a channel, is referred to as a conductorization permeation depth ΔL.

Referring to FIG. 10, a length of the channel portion 131 in the active layer 130, which is overlapped with the gate electrode 160, is represented by "$L_{ideal}$". "$L_{ideal}$" in FIG. 10 may be referred to as an ideal length of the channel portion 131. In FIG. 10, "LD" denotes a length of the first connection portion 132 or the second connection portion 133.

A portion of the channel portion 131 may not be unnecessarily conductorized during the selective conductorization process for the active layer 130, and the conductorized area does not serve as a channel. In FIG. 10, a conductorization permeation depth, which is the length of the conductorized portion of the channel portion 131, is represented by "ΔL". Also, the length of the area of the channel portion 131, which is not conductorized and may serve as an effective channel, is referred to as an effective channel length $L_{eff}$. When the conductorization permeation depth ΔL is increased, the effective channel length $L_{eff}$ becomes smaller.

The thin film transistor should have an effective channel length of a predetermined length or more in order to perform necessary functions. However, when the conductorization permeation depth ΔL is increased, the length of the channel portion 131 should be increased to make sure of the effective channel length $L_{eff}$. As described above, when the length of the channel portion 131 is increased, it is difficult to miniaturize and integrate the device.

According to one aspect of the present disclosure, since fluorine (F) is stably combined with metals of the active layer 130, the conductorization permeation depth ΔL is small to easily make sure of the effective channel length $L_{eff}$. As a result, since the thin film transistor may be driven even by the short channel having a short length of the channel portion 131, the short channel may be implemented.

Figure 11:
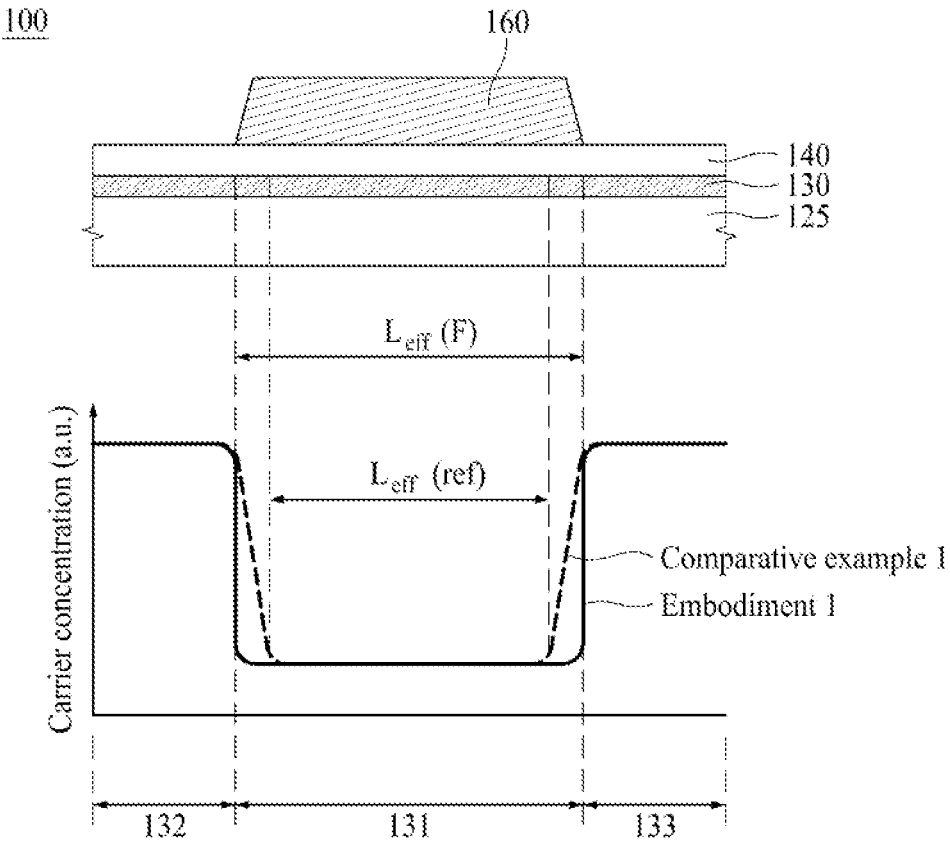
FIG. 11 is a graph illustrating a carrier concentration per area of an active layer.

FIG. 11 is a graph illustrating a carrier concentration per area of the active layer 130. The active layer 130 may be formed of an oxide semiconductor material.

A horizontal axis of FIG. 11 sequentially represents the first connection portion 132, the channel portion 131 and the second connection portion 133. The horizontal axis of FIG. 11 may correspond to a distance measured from a left end of the active layer 130 shown in FIG. 10.

In the graph of FIG. 11, solid lines represent measurement results for the active layer 130 of Aspect 1, which includes fluorine (F) in accordance with the present disclosure, and dotted lines represent measurement results for the active layer 130 of Comparative Example 1, which does not include fluorine (F).

Referring to FIG. 11, a carrier concentration of the channel portion 131 is low, and a carrier concentration of each of the first connection portion 132 and the second connection portion 133, which are formed by the conductorization, is high. Also, a concentration gradient of the carrier is formed between the channel portion 131 and the first connection portion 132 and between the channel portion 131 and the second connection portion 133.

In the active layer 130 of Comparative Example 1, which does not include fluorine (F), the carrier concentration is slowly changed between the channel portion 131 and the first connection portion 132 and between the channel portion 131 and the second connection portion 133, and the conductorization permeation depth ΔL is relatively large. As a result, Comparative Example 1 has a relatively small effective channel length $L_{eff}$(ref).

On the other hand, in the active layer 130 of Aspect 1, which includes fluorine (F), the carrier concentration is slowly changed between the channel portion 131 and the first connection portion 132 and between the channel portion 131 and the second connection portion 133, and the conductorization permeation depth ΔL is very small. As a result, Aspect 1 has a relatively large effective channel length $L_{eff}$ (F).

As described above, according to one aspect of the present disclosure, since the active layer 130 includes fluorine (F), the conductorization permeation depth ΔL is small, and as a result, a short channel may be implemented.

Figure 12A:
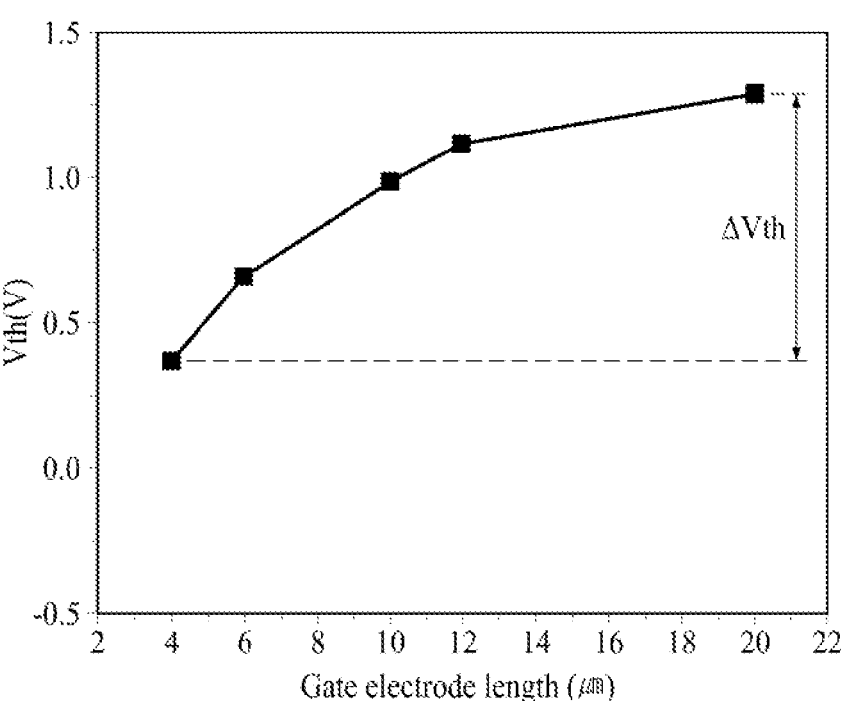
FIGS. 12A and 12B are graphs illustrating a change in a threshold voltage based on a length of a gate electrode.
Figure 12B:
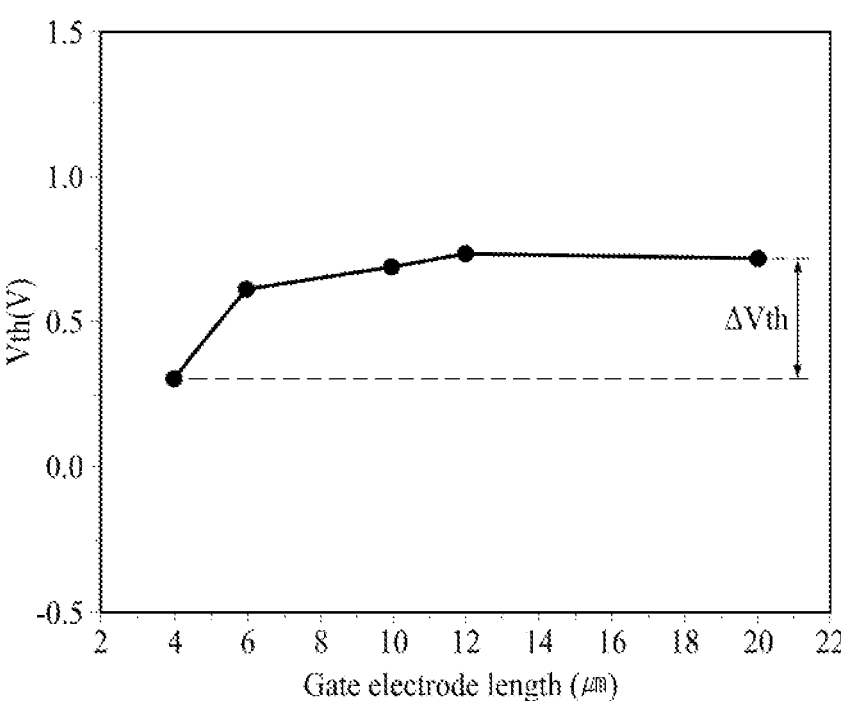

FIGS. 12A and 12B are graphs illustrating a change in a threshold voltage Vth based on a length of the gate electrode 160. The length of the gate electrode 160 corresponds to the length of the channel portion 131 shown in FIG. 10.

In detail, FIG. 12A illustrates a threshold voltage according to the length of the gate electrode 160 in the thin film transistor according to the comparative example in which the active layer 130 does not include fluorine (F). FIG. 12B illustrates a threshold voltage according to the length of the gate electrode 160 in the thin film transistor according to the aspect in which the active layer 130 includes fluorine (F).

Referring to FIGS. 12A and 12B, it is noted that the threshold voltage Vth is increased when the length of the gate electrode 160 is increased. Referring to FIGS. 12A and 12B, when the length of the channel portion 131 is increased, the threshold voltage Vth is increased.

When FIGS. 12A and 12B are compared with each other, it is noted that a threshold voltage variation ΔVth in the thin film transistor of FIG. 12A according to the comparative example is greater than that in the thin film transistor of FIG. 12B according to the aspect. Based on this, in the thin film transistor that includes the active layer 130 including fluorine (F), it is noted that the threshold voltage Vth is not changed significantly even though the length of the channel portion 131 is increased.

Figure 13:
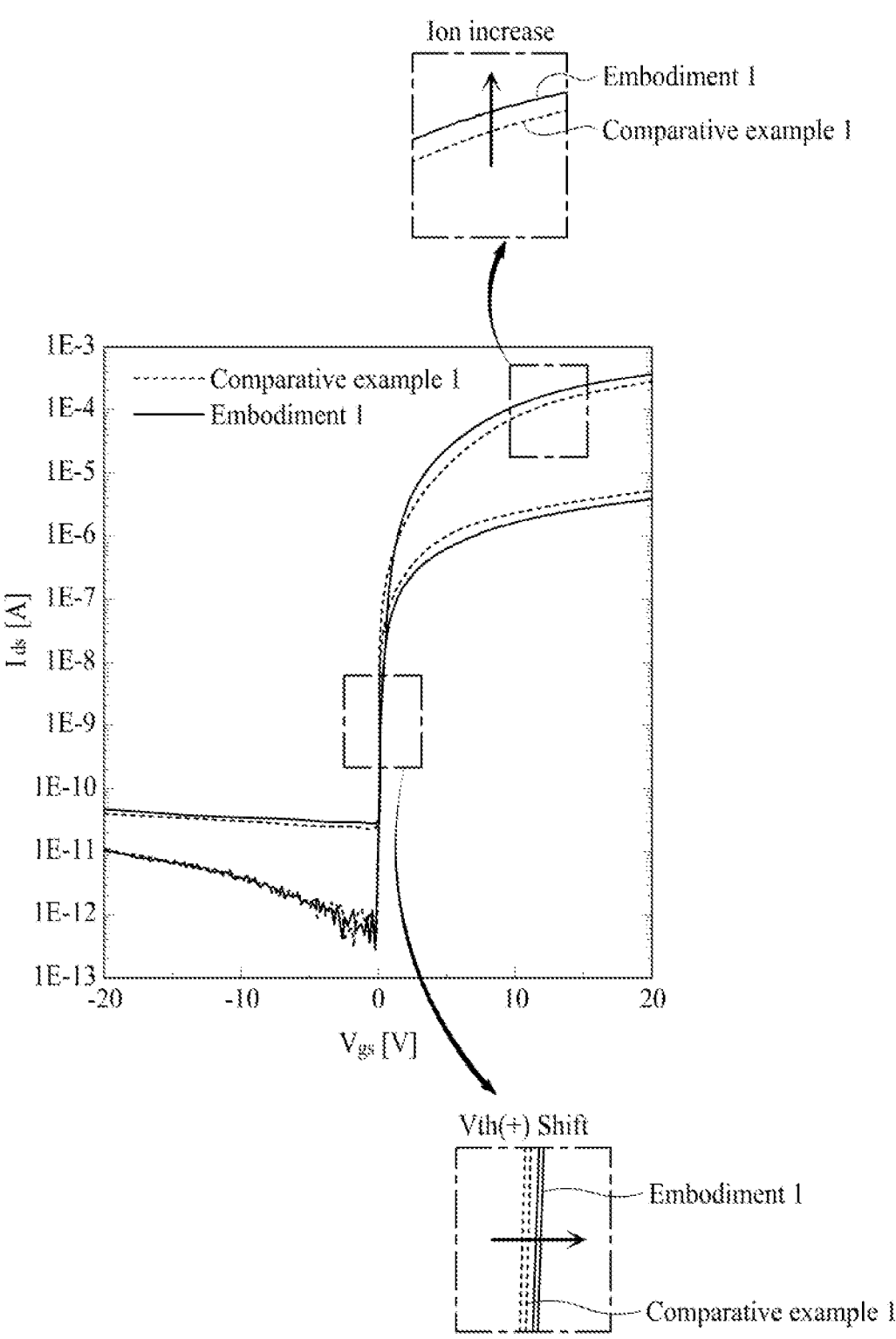
FIG. 13 is a graph illustrating threshold voltages of thin film transistors.

FIG. 13 is a graph illustrating threshold voltages of thin film transistors. A threshold voltage graph is represented by a value of a drain-source current $I_{ds}$ for a gate voltage $V_{gs}$ of a thin film transistor.

In FIG. 13, "Aspect 1" refers to a threshold voltage graph of a thin film transistor according to one aspect of the present disclosure, which includes an active layer 130 including fluorine (F). In FIG. 13, "Comparative Example 1" refers to a threshold voltage graph of a thin film transistor that includes an active layer 130 that does not include fluorine (F).

Referring to FIG. 13, in case of a thin film transistor according to Aspect 1, which includes an active layer 130 including fluorine (F), it is noted that the threshold voltage Vth is larger (right shift) and a current Ion in an ON-state is greater as compared with the thin film transistor according to Comparative Example 1, which includes the active layer 130 that does not include fluorine (F).

Figure 14:
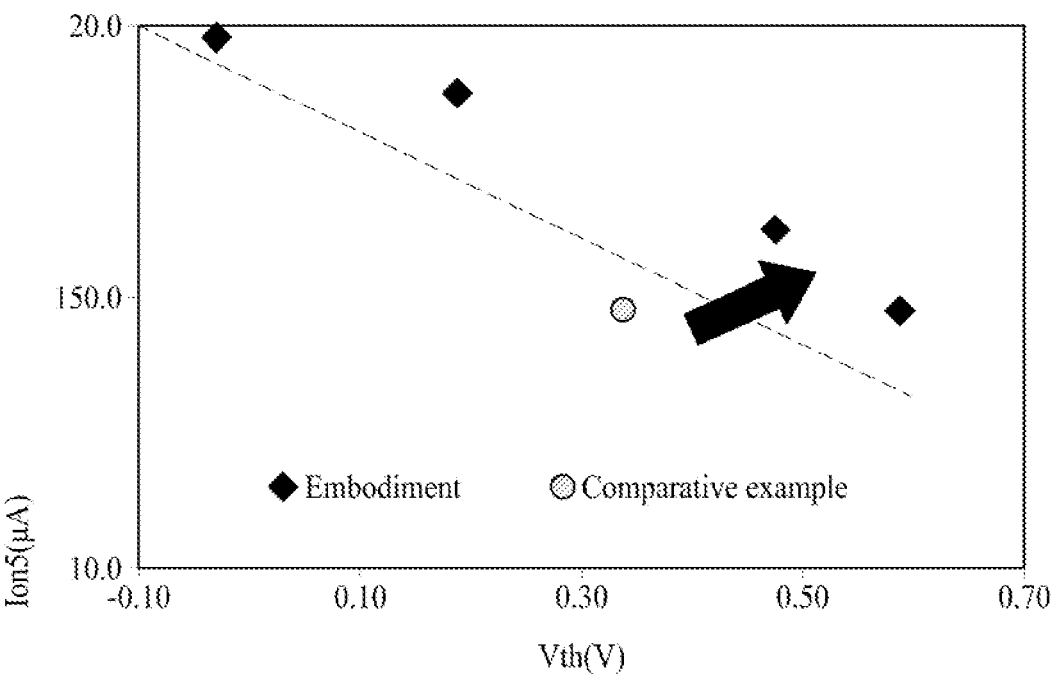
FIG. 14 is a graph illustrating an ON-current based on a threshold voltage.

FIG. 14 is a graph illustrating an ON-current based on a threshold voltage Vth. In FIG. 14, "Ion5" represents the drain-source current $I_{ds}$ when the gate voltage $V_{gs}$ is 5 V, and "Ion5" is referred to as ON-current of the thin film transistor.

In the thin film transistor according to the aspects of the present disclosure, in which the active layer 130 includes fluorine (F), it is noted that the threshold voltage of the thin film transistor is increased and the ON current is reduced as the concentration of fluorine (F) included in the active layer 130 is increased.

When the thin film transistor according to the aspects of the present disclosure, which comprises the active layer 130 including fluorine (F), is compared with the thin film transistor according to Comparative Example, which comprises the active layer 130 that does not include fluorine (F), it is noted that the ON-current of the thin film transistors according to the aspects of the present disclosure is larger in case of the same threshold voltage Vth, and the threshold voltage Vth of the thin film transistors according to the aspects of the present disclosure is greater in case of the same ON-current.

Hereinafter, a fabricating method of a thin film transistor 100 according to one aspect of the present disclosure will be described with reference to FIGS. 15A to 15E.

FIGS. 15A to 15E are views illustrating a fabricating process of a thin film transistor according to one aspect of the present disclosure. A fabricating method of a thin film transistor according to one aspect of the present disclosure includes the steps of forming an active layer 130 on a substrate 110, forming a gate insulating layer 140, which is in contact with the active layer 130, on the substrate 110, and treating the active layer 130 and the gate insulating layer 140 with fluorine (F) at the same time. The step of treating the active layer and the gate insulating layer with fluorine (F) may include at least one of fluorine doping or fluorine plasma treatment.

Figure 15A:
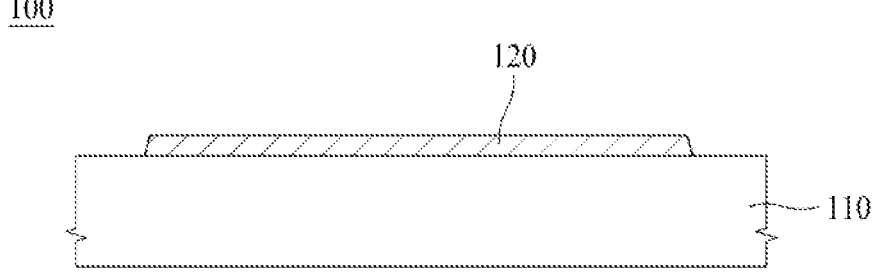
FIGS. 15A to 15E are views illustrating a fabricating process of a thin film transistor according to one aspect of the present disclosure.

In detail, referring to FIG. 15A, a light shielding layer 120 is formed on a substrate 110.

Figure 15B:
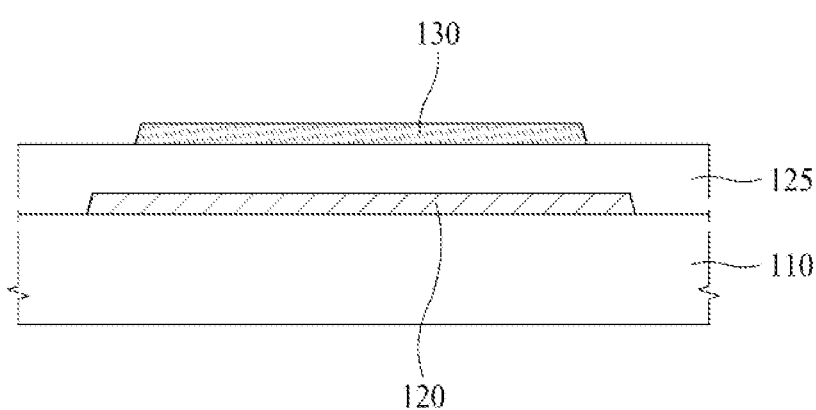

Referring to FIG. 15B, a buffer layer 125 is formed on the light shielding layer 120, and an active layer 130 is formed on the buffer layer 125. The active layer 130 may include an oxide semiconductor material. The active layer 130 may be formed of a single layer, or may have a multi-layered structure of two or more layers.

Figure 15C:
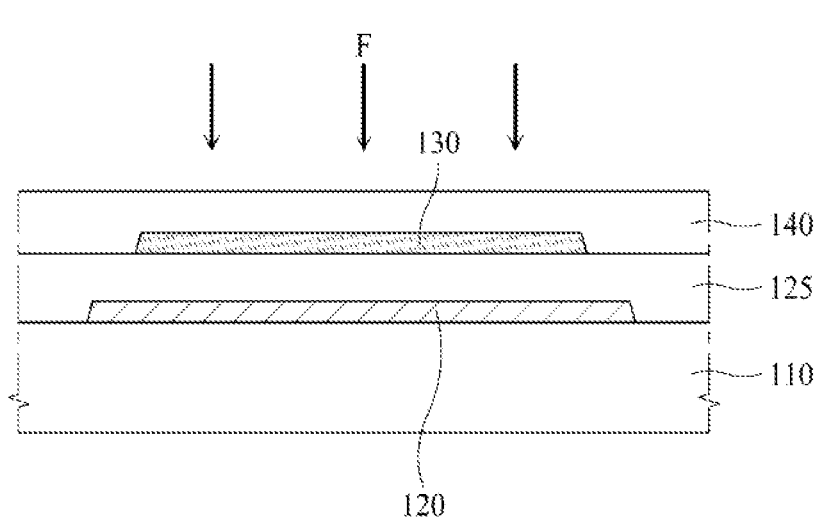

Referring to FIG. 15C, a gate insulating layer 140 is formed on the active layer 130 and treated with fluorine (F). According to one aspect of the present disclosure, fluorine (F) may be injected through the gate insulating layer 140.

The treatment with fluorine (F) may include at least one of fluorine (F) doping or fluorine (F) plasma treatment. For example, as shown in FIG. 15C, the active layer 130 may be doped with fluorine (F) by fluorine (F) doping through the gate insulating layer 140. Alternatively, the active layer 130 may be doped with fluorine (F) by fluorine (F) plasma treatment with respect to the gate insulating layer 140. As a result, the active layer 130 may include fluorine (F).

According to one aspect of the present disclosure, the gate insulating layer 140 and the buffer layer 125 may be also treated with fluorine (F). For example, the gate insulating layer 140 and the buffer layer 125 may also include fluorine by fluorine (F) doping or fluorine (F) plasma treatment.

According to one aspect of the present disclosure, after the fluorine (F) treatment, the gate insulating layer 140 and the active layer 130 may be treated with heat. A metal and fluorine (F) may form a stable bond in the active layer 130 by the heat treatment. In addition, hydrogen and fluorine (F), which are included in the gate insulating layer 140, may be combined with each other by the heat treatment.

According to one aspect of the present disclosure, the buffer layer 125 may be also treated with heat during the heat treatment step. Hydrogen and fluorine (F), which are included in the buffer layer 125, may be combined with each other by heat treatment.

According to one aspect of the present disclosure, the heat treatment may be carried out at a temperature in the range of 50° C. to 350° C.

Figure 15D:
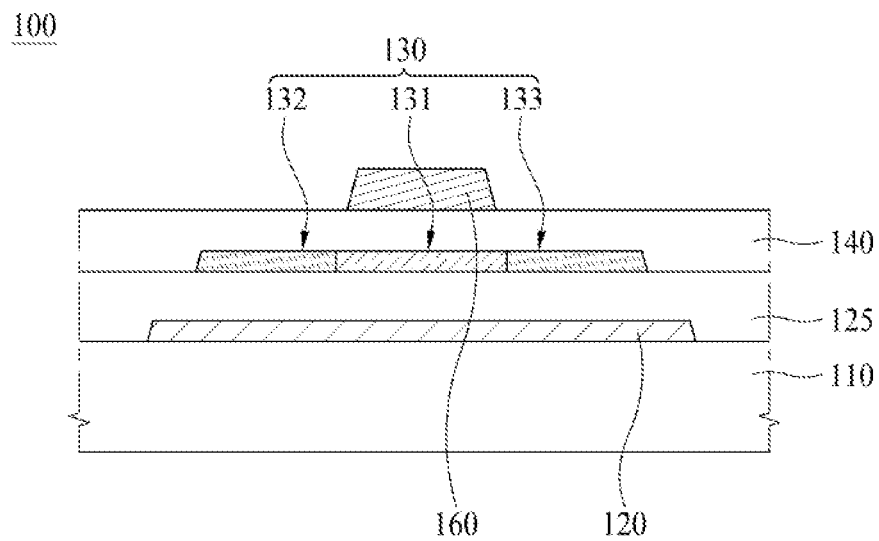

Referring to FIG. 15D, a gate electrode 160 is formed on the gate insulating layer 140. In addition, selective conductorization may be performed for the active layer 130.

For example, in accordance with selective conductorization using the gate electrode 160 as a mask, an area of the active layer 130, which is overlapped with the gate electrode 160, is not conductorized so that the area may become the channel portion 131, and an area of the active layer 130, which is not overlapped with the gate electrode 160, is conductorized so that the area may become the first connection portion 132 and the second connection portion 133.

Figure 15E:
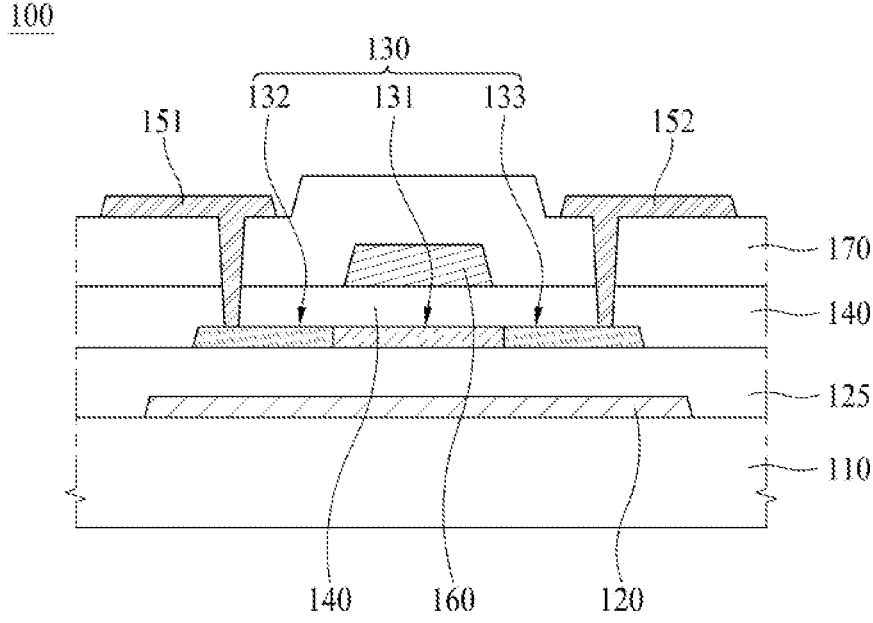

Referring to FIG. 15E, an interlayer insulating layer 170 may be formed on the gate electrode 160, and a source electrode 151 and a drain electrode 152 may be formed on the interlayer insulating layer 170. As a result, a thin film transistor 100 according to one aspect of the present disclosure may be made.

Hereinafter, a display device 700 including the thin film transistors 100, 200, 300, 400, 500 and 600 according to the aspects of the present disclosure will be described with reference to FIGS. 16 to 22.

Figure 16:
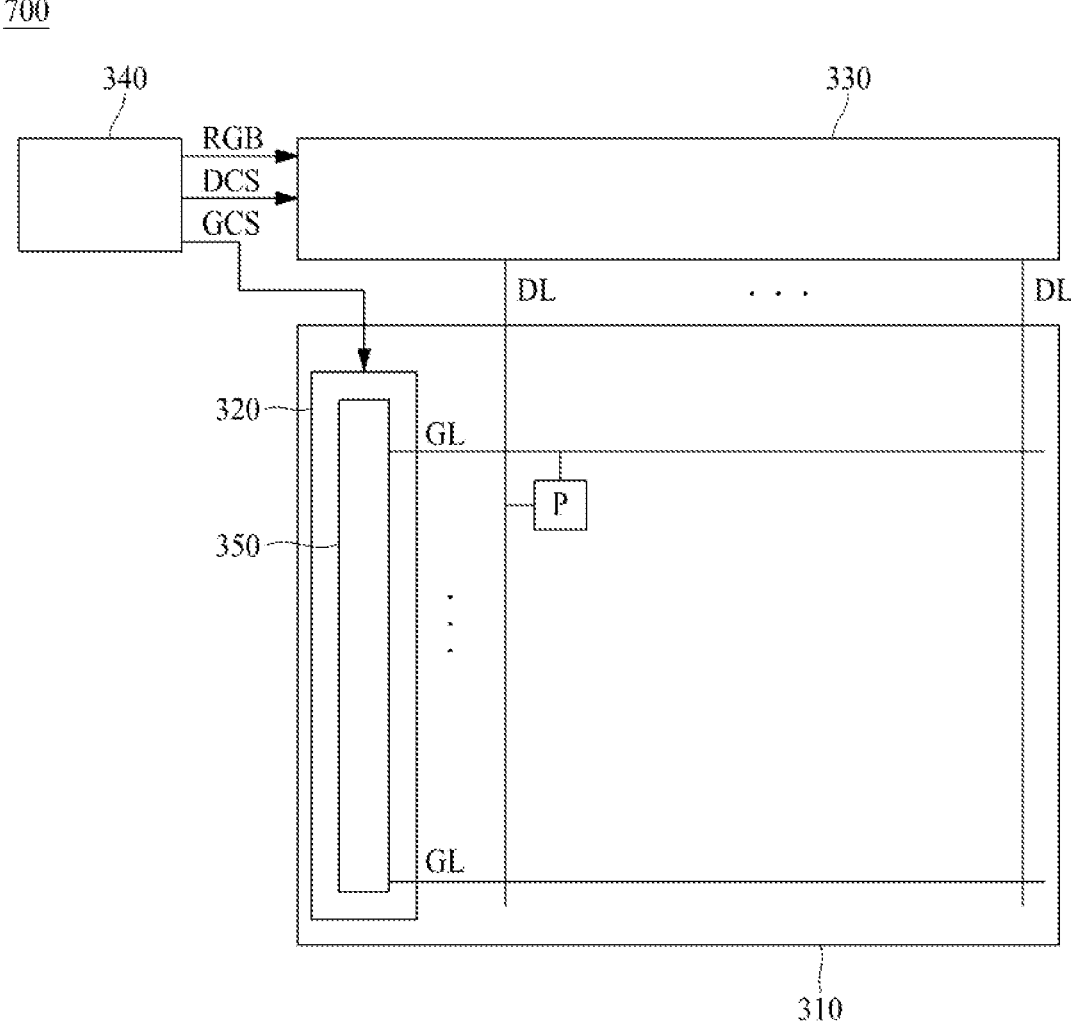
FIG. 16 is a schematic view illustrating a display device according to another aspect of the present disclosure.

FIG. 16 is a schematic view illustrating a display device 700 according to another aspect of the present disclosure.

As shown in FIG. 16, the display device 700 according to another aspect of the present disclosure includes a display panel 310, a gate driver 320, a data driver 330 and a controller 340.

Gate lines GL and data lines DL are disposed in the display panel 310, and pixels P are disposed in intersection areas of the gate lines GL and the data lines DL. An image is displayed by driving of the pixels P.

The controller 340 controls the gate driver 320 and the data driver 330.

The controller 340 outputs a gate control signal GCS for controlling the gate driver 320 and a data control signal DCS for controlling the data driver 330 by using a signal supplied from an external system (not shown). Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst and a gate clock GCLK. Also, control signals for controlling a shift register may be included in the gate control signal GCS.

The data control signal DCS includes a source start pulse SSP, a source shift clock signal SSC, a source output enable signal SOE and a polarity control signal POL.

The data driver 330 supplies a data voltage to the data lines DL of the display panel 310. In detail, the data driver 330 converts the image data RGB input from the controller 340 into an analog data voltage and supplies the data voltage to the data lines DL.

The gate driver 320 may include a shift register 350.

The shift register 350 sequentially supplies gate pulses to the gate lines GL for one frame by using the start signal and the gate clock, which are transmitted from the controller 340. In this case, one frame means a time period when one image is output through the display panel 310. The gate pulse has a turn-on voltage capable of turning on a switching element (thin film transistor) disposed in the pixel P.

Also, the shift register 350 supplies a gate-off signal capable of turning off a switching element, to the gate line GL for the other period of one frame, at which the gate pulse is not supplied. Hereinafter, the gate pulse and the gate-off signal will be collectively referred to as a scan signal SS or Scan.

According to one aspect of the present disclosure, the gate driver 320 may be packaged on the substrate 110. In this way, a structure in which the gate driver 320 is directly packaged on the substrate 110 will be referred to as a Gate In Panel (GIP) structure.

Figure 17:
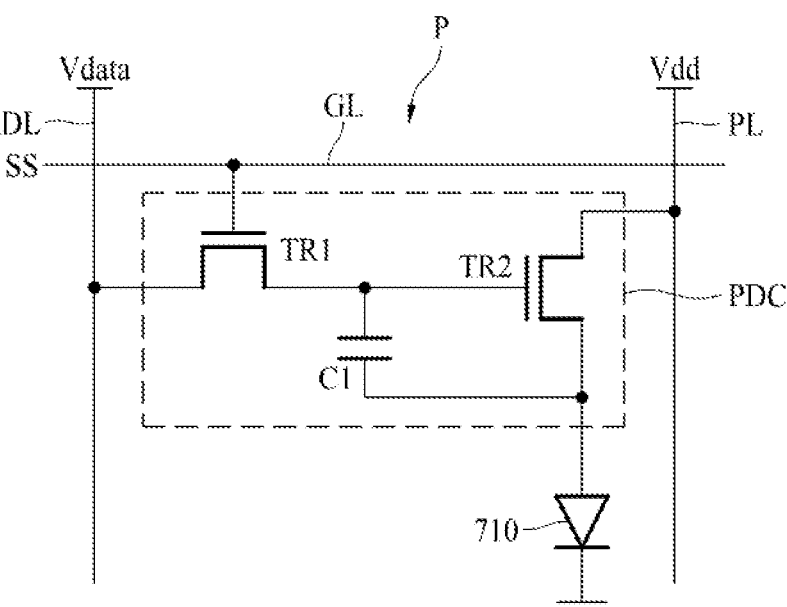
FIG. 17 is a circuit diagram illustrating any one pixel of FIG. 16.
Figure 18:
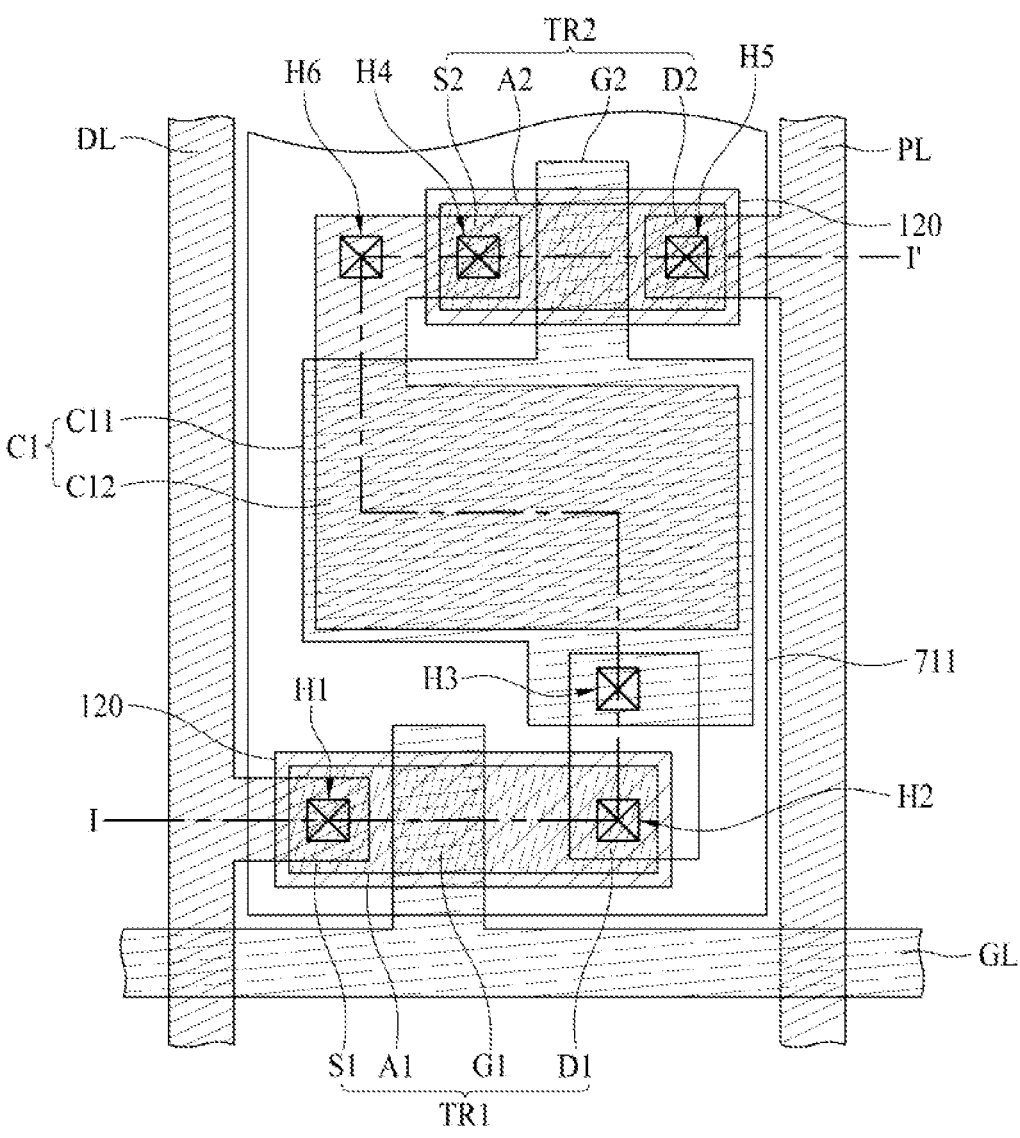
FIG. 18 is a plan view illustrating a pixel of FIG. 17.
Figure 19:
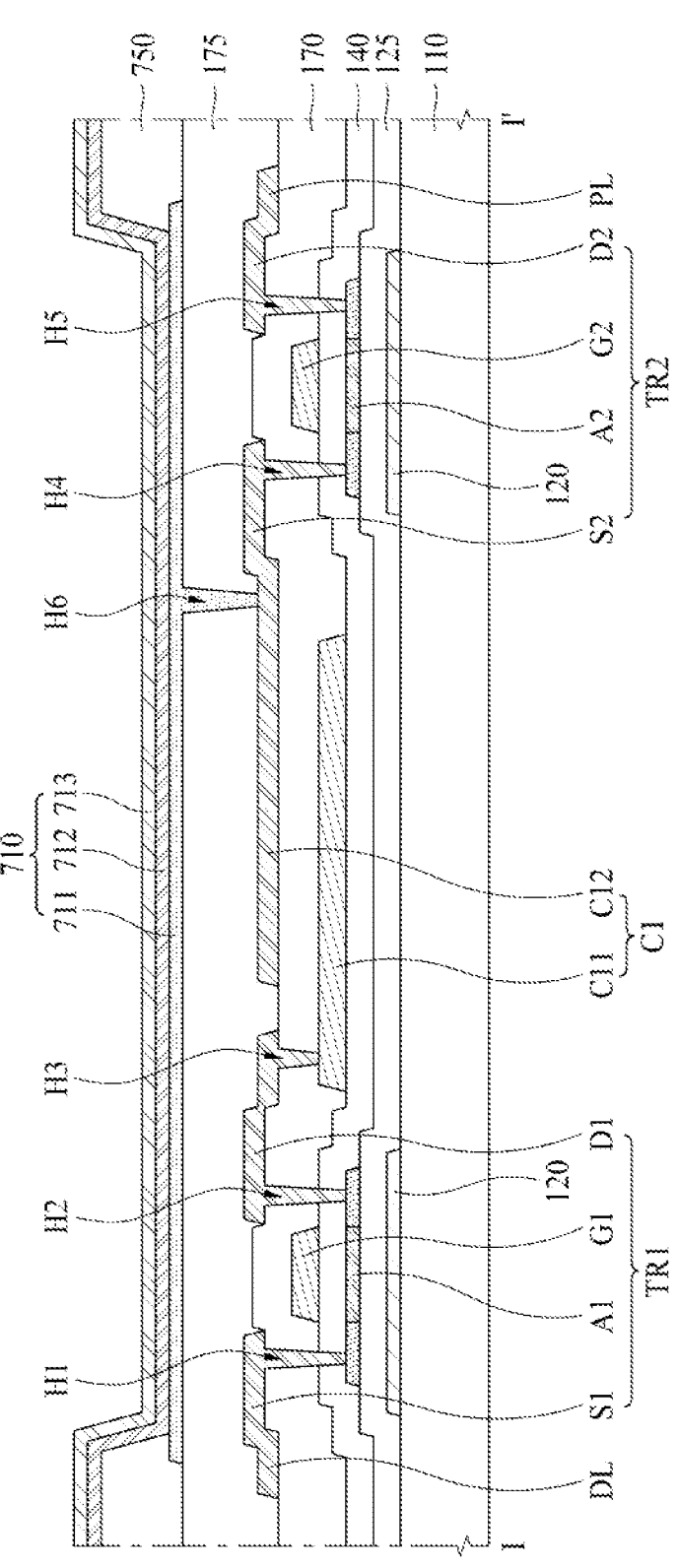
FIG. 19 is a cross-sectional view taken along line I-I' of FIG. 18.

FIG. 17 is a circuit diagram illustrating any one pixel P of FIG. 16, FIG. 18 is a plan view illustrating a pixel P of FIG. 17, and FIG. 19 is a cross-sectional view taken along line I-I' of FIG. 18.

The circuit diagram of FIG. 17 is an equivalent circuit diagram for the pixel P of the display device 700 that includes an organic light emitting diode (OLED) as a display element 710.

The pixel P includes a display element 710 and a pixel driving circuit PDC for driving the display element 710.

The pixel driving circuit PDC of FIG. 17 includes a first thin film transistor TR1 that is a switching transistor, and a second thin film transistor TR2 that is a driving transistor. The display device 700 according to another aspect of the present disclosure may include at least one of the thin film transistors 100, 200, 300, 400, 500 and 600 shown in FIGS. 1 and 4 to 8.

The first thin film transistor TR1 is connected to the gate line GL and the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

A driving power line PL provides a driving voltage Vdd to the display element 710, and the second thin film transistor TR2 controls the driving voltage Vdd. The driving voltage Vdd is a pixel driving voltage for driving the organic light emitting diode (OLED) that is the display element 710.

When the first thin film transistor TR1 is turned on by the scan signal SS applied from the gate driver 320 through the gate line GL, the data voltage Vdata supplied through the data line DL is supplied to a gate electrode G2 of the second thin film transistor TR2 connected with the display element 710. The data voltage Vdata is charged in a first capacitor C1 formed between the gate electrode G2 and a source electrode S2 of the second thin film transistor TR2. The first capacitor C1 is a storage capacitor Cst.

The amount of a current supplied to the organic light emitting diode (OLED), which is the display element 710, through the second thin film transistor TR2 is controlled in accordance with the data voltage Vdata, whereby a gray scale of light emitted from the display element 710 may be controlled.

Referring to FIGS. 18 and 19, the first thin film transistor TR1 and the second thin film transistor TR2 are disposed on the substrate 110.

The substrate 110 may be made of glass or plastic. Plastic having a flexible property, for example, polyimide (PI) may be used as the substrate 110.

A light shielding layer 120 is disposed on one surface of the substrate 110. The light shielding layer 120 may shield light incident from the outside to protect active layers A1 and A2.

A buffer layer 125 is disposed on the light shielding layer 120. The buffer layer 125 is made of an insulating material, and protects the active layers A1 and A2 from external water or oxygen.

The active layer A1 of the first thin film transistor TR1 and the active layer A2 of the second thin film transistor TR2 are disposed on the buffer layer 125.

Each of the active layers A1 and A2 may include an oxide semiconductor material. According to another aspect of the present disclosure, the active layers A1 and A2 are oxide semiconductor layers made of an oxide semiconductor material. Each of the active layers A1 and A2 may be formed of a single layer, or may have a stacked structure of multiple layers.

A gate insulating layer 140 is disposed on the active layers A1 and A2. The gate insulating layer 140 has insulation properties, and spaces the active layers A1 and A2 apart from the gate electrodes G1 and G2. The gate insulating layer 140 that is not patterned is shown in FIG. 19, but another aspect of the present disclosure is not limited thereto. The gate insulating layer 140 may be patterned as shown in FIG. 1.

The gate electrode G1 of the first thin film transistor TR1 and the gate electrode G2 of the second thin film transistor TR2 are disposed on the gate insulating layer 140.

The gate electrode G1 of the first thin film transistor TR1 overlaps at least a portion of the active layer A1 of the first thin film transistor TR1.

The gate electrode G2 of the second thin film transistor TR2 overlaps at least a portion of the active layer A2 of the second thin film transistor TR2.

Referring to FIGS. 18 and 19, a first capacitor electrode C11 of the first capacitor C1 is disposed in the same layer as the gate electrodes G1 and G2. The gate electrodes G1 and G2 and the first capacitor electrode C11 may be made together by the same process using the same material.

An interlayer insulating layer 170 is disposed on the gate electrodes G1 and G2 and the first capacitor electrode C11.

The source electrodes S1 and S2 and the drain electrodes D1 and D2 are disposed on the interlayer insulating layer 170. According to one aspect of the present disclosure, the source electrodes S1 and S2 and the drain electrodes D1 and D2 are distinguished for convenience of description, and the source electrodes S1 and S2 and the drain electrodes D1 and D2 may be used interchangeably. Therefore, the source electrodes S1 and S2 may be the drain electrodes D1 and D2, and the drain electrodes D1 and D2 may be the source electrodes S1 and S2.

A data line DL and a driving power line PL are disposed on the interlayer insulating layer 170. The source electrode S1 of the first thin film transistor TR1 may be integrally formed with the data line DL. The drain electrode D2 of the second thin film transistor TR2 may be integrally formed with the driving power line PL.

According to one aspect of the present disclosure, the source electrode S1 and the drain electrode D1 of the first thin film transistor TR1 are spaced apart from each other and connected with the active layer A1 of the first thin film transistor TR1. The source electrode S2 and the drain electrode D2 of the second thin film transistor TR2 are spaced apart from each other and connected with the active layer A2 of the second thin film transistor TR2.

In detail, the source electrode S1 of the first thin film transistor TR1 is in contact with a source area of the active layer A1 through a first contact hole H1.

The drain electrode D1 of the first thin film transistor TR1 is in contact with a drain area of the active layer A1 through a second contact hole H2, and is connected with the first capacitor electrode C11 of the first capacitor C1 through a third contact hole H3.

The source electrode S2 of the second thin film transistor TR2 is extended over the interlayer insulating layer 170, and thus a portion thereof serves as a second capacitor electrode C12 of the first capacitor C1. The first capacitor electrode C11 and the second capacitor electrode C12 are overlapped with each other to form the first capacitor C1.

The source electrode S2 of the second thin film transistor TR2 is in contact with the source area of the active layer A2 through a fourth contact hole H4.

The drain electrode D2 of the second thin film transistor TR2 is in contact with the drain area of the active layer A2 through a fifth contact hole H5.

The first thin film transistor TR1 includes an active layer A1, a gate electrode G1, a source electrode S1 and a drain electrode D1, and serves as a switching transistor for controlling the data voltage Vdata applied to the pixel driving circuit PDC.

The second thin film transistor TR2 includes an active layer A2, a gate electrode G2, a source electrode S2 and a drain electrode D2, and serves as a driving transistor for controlling the driving voltage Vdd applied to the display element 710.

A passivation layer 175 is disposed on the source electrodes S1 and S2, the drain electrodes D1 and D2, the data line DL and the driving power line PL. The passivation layer 175 planarizes upper portions of the first thin film transistor TR1 and the second thin film transistor TR2, and protects the first thin film transistor TR1 and the second thin film transistor TR2.

A first electrode 711 of the display element 710 is disposed on the passivation layer 175. The first electrode 711 of the display element 710 is connected with the source electrode S2 of the second thin film transistor TR2 through a sixth contact hole H6 formed in the passivation layer 175.

A bank layer 750 is disposed at an edge of the first electrode 711. The bank layer 750 defines a light emission area of the display element 710.

An organic light emitting layer 712 is disposed on the first electrode 711, and a second electrode 713 is disposed on the organic light emitting layer 712. Therefore, the display element 710 is completed. The display element 710 shown in FIG. 19 is an organic light emitting diode (OLED). Therefore, the display device 700 according to another aspect of the present disclosure is an organic light emitting display device.

Figure 20:
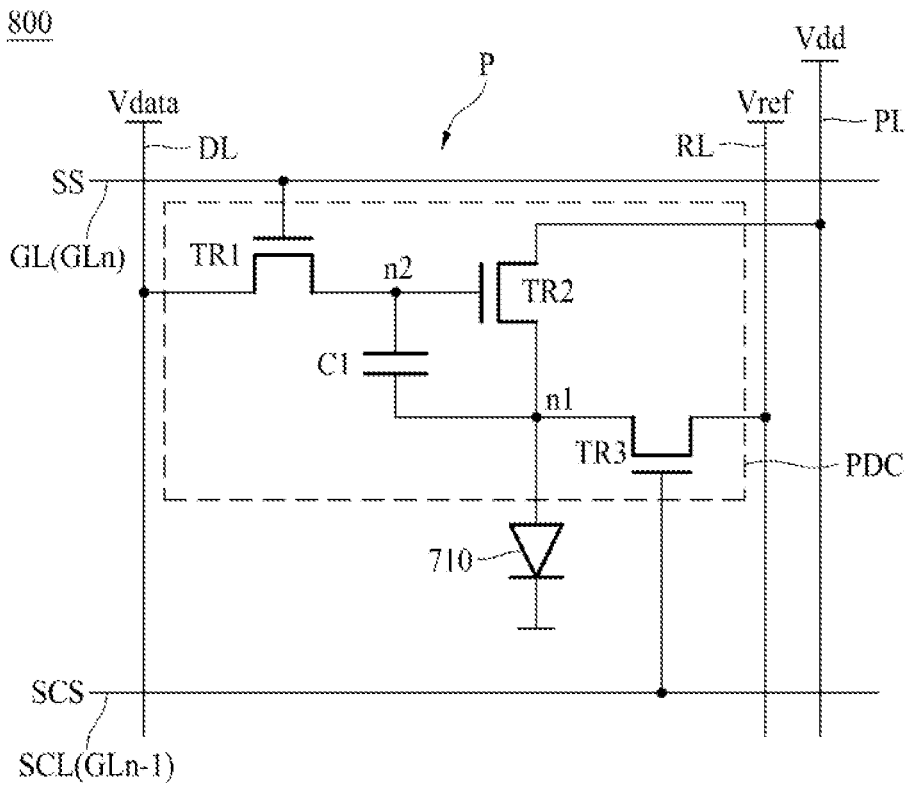
FIG. 20 is a circuit diagram illustrating a pixel of a display device according to still another aspect of the present disclosure.

FIG. 20 is a circuit diagram illustrating a pixel P of a display device 800 according to still another aspect of the present disclosure.

FIG. 20 is an equivalent circuit diagram illustrating a pixel P of an organic light emitting display device.

The pixel P of the display device 800 shown in FIG. 20 includes an organic light emitting diode (OLED) that is a display element 710 and a pixel driving circuit PDC for driving the display element 710. The display element 710 is connected with the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

Referring to FIG. 20, assuming that a gate line of an (n)th pixel P is "$GL_n$", a gate line of a (n−1)th pixel P adjacent to the (n)th pixel P is "$GL_{n-1}$", and the gate line "$GL_{n-1}$" of the (n−1)th pixel P serves as a sensing control line SCL of the (n)th pixel P.

The pixel driving circuit PDC includes, for example, a first thin film transistor TR1 (switching transistor) connected with the gate line GL and the data line DL, a second thin film transistor TR2 (driving transistor) for controlling a magnitude of a current output to the display element 710 in accordance with the data voltage Vdata transmitted through the first thin film transistor TR1, and a third thin film transistor TR3 (reference transistor) for sensing characteristics of the second thin film transistor TR2.

A first capacitor C1 is positioned between a gate electrode G2 of the second thin film transistor TR2 and the display element 710. The first capacitor C1 is referred to as a storage capacitor Cst.

The first thin film transistor TR1 is turned on by the scan signal SS supplied to the gate line GL to transmit the data voltage Vdata, which is supplied to the data line DL, to the gate electrode G2 of the second thin film transistor TR2.

The third thin film transistor TR3 is connected to a first node n1 between the second thin film transistor TR2 and display element 710 and the reference line RL, and thus is turned on or off by the sensing control signal SCS and senses characteristics of the second thin film transistor TR2, which is a driving transistor, for a sensing period.

A second node n2 connected with the gate electrode G2 of the second thin film transistor TR2 is connected with the first thin film transistor TR1. The first capacitor C1 is formed between the second node n2 and the first node n1.

When the first thin film transistor TR1 is turned on, the data voltage Vdata supplied through the data line DL is supplied to the gate electrode G2 of the second thin film transistor TR2. The data voltage Vdata is charged in the first capacitor C1 formed between the gate electrode G2 and the source electrode S2 of the second thin film transistor TR2.

When the second thin film transistor TR2 is turned on, the current is supplied to the display element 710 through the second thin film transistor TR2 in accordance with the driving voltage Vdd for driving the pixel, whereby light is output from the display element 710.

The display device 800 according to still another aspect of the present disclosure may include at least one of the thin film transistors 100, 200, 300, 400, 500 and 600 shown in FIGS. 1 and 4 to 8.

Figure 21:
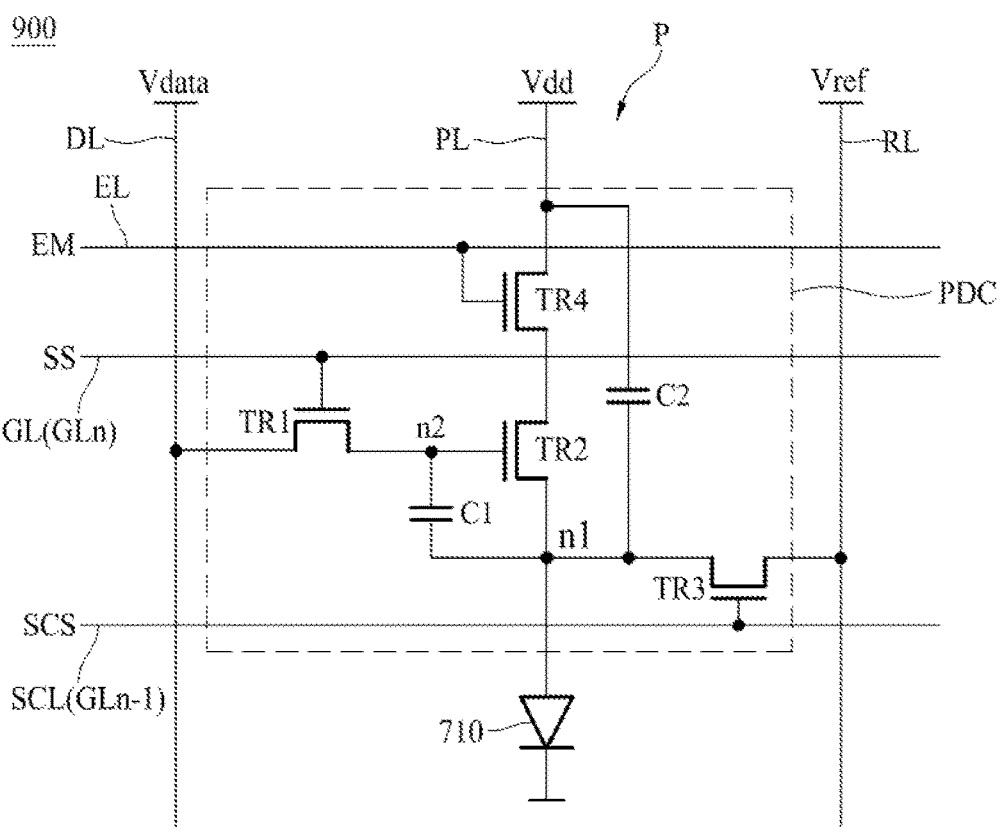
FIG. 21 is a circuit diagram illustrating a pixel of a display device according to further still another aspect of the present disclosure.

FIG. 21 is a circuit diagram illustrating a pixel of a display device 900 according to further still another aspect of the present disclosure.

The pixel P of the display device 900 shown in FIG. 21 includes an organic light emitting diode (OLED) that is a display element 710 and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying a driving signal to the pixel driving circuit PDC are disposed.

In comparison with the pixel P of FIG. 20, the pixel P of FIG. 20 further includes an emission control line EL. An emission control signal EM is supplied to the emission control line EL.

Also, the pixel driving circuit PDC of FIG. 21 further includes a fourth thin film transistor TR4 that is an emission control transistor for controlling a light emission timing of the second thin film transistor TR2, in comparison with the pixel driving circuit PDC of FIG. 20.

Referring to FIG. 21, assuming that a gate line of an (n)th pixel P is "$GL_n$", a gate line of a (n−1)th pixel P adjacent to the (n)th pixel P is "$GL_{n-1}$" and the gate line "$GL_{n-1}$" of the (n−1)th pixel P serves as a sensing control line SCL of the (n)th pixel P.

A first capacitor C1 is positioned between the gate electrode G2 of the second thin film transistor TR2 and the display element 710. A second capacitor C2 is positioned between one of terminals of the fourth thin film transistor TR4, to which a driving voltage Vdd is supplied, and one electrode of the display element 710.

The first thin film transistor TR1 is turned on by the scan signal SS supplied to the gate line GL to transmit the data voltage Vdata, which is supplied to the data line DL, to the gate electrode G2 of the second thin film transistor TR2.

The third thin film transistor TR3 is connected to the reference line RL, and thus is turned on or off by the sensing control signal SCS and senses characteristics of the second thin film transistor TR2, which is a driving transistor, for a sensing period.

The fourth thin film transistor TR4 transfers the driving voltage Vdd to the second thin film transistor TR2 in accordance with the emission control signal EM or shields the driving voltage Vdd. When the fourth thin film transistor TR4 is turned on, a current is supplied to the second thin film transistor TR2, whereby light is output from the display element 710.

The display device 900 according to further still another aspect of the present disclosure may include at least one of the thin film transistors 100, 200, 300, 400, 500 and 600 shown in FIGS. 1 and 4 to 8.

The pixel driving circuit PDC according to further still another aspect of the present disclosure may be formed in various structures in addition to the above-described structure. The pixel driving circuit PDC may include, for example, five or more thin film transistors.

Figure 22:
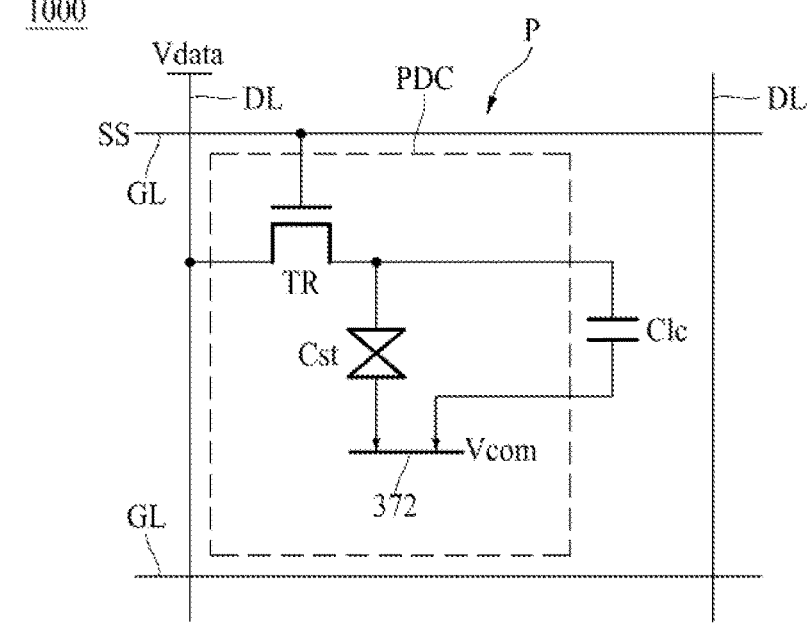
FIG. 22 is a circuit diagram illustrating a pixel of a display device according to further still another aspect of the present disclosure.

FIG. 22 is a circuit diagram illustrating a pixel P of a display device 1000 according to further still another aspect of the present disclosure.

The display device 1000 of FIG. 22 is a liquid crystal display device.

The pixel P of the display device 1000 shown in FIG. 22 includes a pixel driving circuit PDC and a liquid crystal capacitor Clc connected with the pixel driving circuit PDC. The liquid crystal capacitor Clc corresponds to the display element.

The pixel driving circuit PDC includes a thin film transistor TR connected with the gate line GL and the data line DL, and a storage capacitor Cst connected between the thin film transistor TR and a common electrode 372. The liquid crystal capacitor Clc is connected with the storage capacitor Cst in parallel between the thin film transistor TR and the common electrode 372.

The liquid crystal capacitor Clc charges a differential voltage between a data signal supplied to a pixel electrode through the thin film transistor TR and a common voltage Vcom supplied to the common electrode 372, and controls a light-transmissive amount by driving liquid crystals in accordance with the charged voltage. The storage capacitor Cst stably maintains the voltage charged in the liquid crystal capacitor Clc.

The display device 1000 according to further still another aspect of the present disclosure may include at least one of the thin film transistors 100, 200, 300, 400, 500 and 600 shown in FIGS. 1 and 4 to 8.

According to the present disclosure, the following advantageous effects may be obtained.

The thin film transistor according to one aspect of the present disclosure comprises an active layer including fluorine (F), and may further comprise at least one of a gate insulating layer including fluorine (F) or a buffer layer including fluorine (F). As described above, the thin film transistor including the fluorine (F) may have excellent stability and reliability.

According to one aspect of the present disclosure, since fluorine (F) forms a stable bond in the active layer, oxygen vacancy is avoided, and stability of the active layer is improved, whereby the threshold voltage of the thin film transistor may be prevented from being shifted in a negative direction (negative shift). As a result, driving stability of the thin film transistor is improved.

According to one aspect of the present disclosure, as oxygen of the active layer is substituted with fluorine (F), free electrons are increasingly generated, whereby mobility of the thin film transistor may be increased and the ON-current may be improved.

According to one aspect of the present disclosure, fluorine (F) is stably combined with hydrogen in the gate insulating layer or the buffer layer, whereby conductorization permeation due to hydrogen may be avoided, whereby the conductorization permeation depth $\Delta L$ of the active layer may be minimized, and as a result, the short channel may be formed.

It will be apparent to those skilled in the art that the present disclosure described above is not limited by the above-described aspects and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A thin film transistor comprising:
an active layer disposed on a substrate;
a gate electrode spaced apart from the active layer and at least partially overlapping with the active layer; and
a gate insulating layer disposed between the active layer and the gate electrode,
wherein the active layer includes fluorine (F) and has a first surface in a direction opposite to the substrate,
wherein the active layer has a concentration gradient of fluorine (F) in which a concentration gradient of fluorine (F) along a direction parallel with the first surface is smaller than that of fluorine (F) along a direction perpendicular to the first surface,
wherein the gate insulating layer includes fluorine (F), and
wherein the concentration gradient of fluorine (F) along the direction parallel with the first surface in the gate insulating layer is smaller than that of fluorine (F) along the direction perpendicular to the first surface.

2. The thin film transistor of claim 1, wherein the active layer has a concentration gradient of fluorine (F), which is reduced along a direction from the first surface to the substrate.

3. The thin film transistor of claim 1, wherein the active layer has a concentration gradient of fluorine (F), which is increased along a direction from the first surface to the substrate.

4. The thin film transistor of claim 1, wherein the active layer has a concentration gradient of fluorine (F), which is increased and then reduced along a direction from the first surface to the substrate.

5. The thin film transistor of claim 1, wherein the active layer does not substantially have a concentration gradient of fluorine along the direction parallel with the first surface at a same depth from the first surface.

6. The thin film transistor of claim 1, wherein the fluorine in the active layer has a concentration of between 0.001 atomic % (at %) and 10 at %.

7. The thin film transistor of claim 1, wherein the gate insulating layer has no substantial concentration gradient of fluorine along the direction parallel with a surface of the substrate.

8. The thin film transistor of claim 1, wherein the gate insulating layer has a concentration gradient of fluorine, which is increased along a direction toward the substrate.

9. The thin film transistor of claim 1, wherein the gate insulating layer has a concentration gradient of fluorine, which is increased and then reduced along a direction toward the substrate.

10. The thin film transistor of claim 1, wherein the gate insulating layer is disposed at a point having a same height as that of the active layer based on the surface of the substrate, and wherein a concentration of fluorine in the gate insulating layer is increased at a period, at which a concentration of fluorine in the active layer is increased, along the direction toward the substrate, and a concentration of fluorine in the gate insulating layer is reduced at a period at which the concentration of fluorine in the active layer is reduced.

11. A thin film transistor comprising:

a buffer layer on a substrate, an active layer disposed on the buffer layer; and a gate electrode spaced apart from the active layer and at least partially overlapping with the active layer, wherein the active layer includes fluorine (F) and has a first surface in a direction opposite to the substrate, wherein the active layer has a concentration gradient of fluorine (F) in which a concentration gradient of fluorine (F) along a direction parallel with the first surface is smaller than that of fluorine (F) along a direction perpendicular to the first surface, and wherein the buffer layer includes fluorine (F).

12. The thin film transistor of claim 11, wherein, in the buffer layer, a concentration gradient of fluorine (F) along the direction parallel with the surface of the substrate is smaller than that of fluorine (F) along the direction perpendicular to the surface of the substrate.

13. The thin film transistor of claim 11, wherein the buffer layer has no substantial concentration gradient of fluorine along the direction parallel with the surface of the substrate.

14. The thin film transistor of claim 11, wherein the buffer layer has a concentration gradient of fluorine, which is reduced along the direction toward the substrate.

15. The thin film transistor of claim 11, wherein the buffer layer has a concentration gradient of fluorine, which is increased and then reduced along the direction toward the substrate.

16. The thin film transistor of claim 1, wherein the active layer includes an oxide semiconductor material.

17. The thin film transistor of claim 1, wherein the active layer includes:

a first oxide semiconductor layer; and a second oxide semiconductor layer disposed on the first oxide semiconductor layer.

18. The thin film transistor of claim 17, wherein the active layer further includes a third oxide semiconductor layer disposed on the second oxide semiconductor layer.

19. A display device comprising the thin film transistor of claim 1.

* * * * *